(12) United States Patent
Cho et al.

(10) Patent No.: US 9,196,812 B2
(45) Date of Patent: Nov. 24, 2015

(54) SEMICONDUCTOR LIGHT EMITTING DEVICE AND SEMICONDUCTOR LIGHT EMITTING APPARATUS HAVING THE SAME

(71) Applicant: Samsung Electronics Co., Ltd., Suwon-Si, Gyeonggi-Do (KR)

(72) Inventors: Myong Soo Cho, Yongin-si (KR); Yong-Il Kim, Suwon-si (KR); Jin Ha Kim, Yongin-si (KR); Kwang Min Song, Suwon-si (KR); Sang Seok Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/543,481

(22) Filed: Nov. 17, 2014

(65) Prior Publication Data

US 2015/0171298 A1    Jun. 18, 2015

(30) Foreign Application Priority Data

Dec. 17, 2013  (KR) .......................... 10-2013-0157164
Aug. 4, 2014   (KR) .......................... 10-2014-0099816

(51) Int. Cl.
*H01L 33/44* (2010.01)
*H01L 33/62* (2010.01)
*H01L 33/20* (2010.01)
*H01L 33/40* (2010.01)

(52) U.S. Cl.
CPC ................ *H01L 33/62* (2013.01); *H01L 33/20* (2013.01); *H01L 33/405* (2013.01); *H01L 33/44* (2013.01)

(58) Field of Classification Search
CPC ....... H01L 33/62; H01L 33/20; H01L 33/405; H01L 33/44
See application file for complete search history.

(56) References Cited

U.S. PATENT DOCUMENTS

| 6,372,608 | B1 | 4/2002 | Shimoda et al. |
| 6,387,793 | B1 | 5/2002 | Yap et al. |
| 6,645,830 | B2 | 11/2003 | Shimoda et al. |
| RE38,466 | E | 3/2004 | Inoue et al. |
| 6,818,465 | B2 | 11/2004 | Biwa et al. |

(Continued)

FOREIGN PATENT DOCUMENTS

| JP | 2004502294 A | 1/2004 |
| JP | 4666608 B2 | 4/2011 |

(Continued)

*Primary Examiner* — Long Pham
(74) *Attorney, Agent, or Firm* — Harness, Dickey & Pierce, P.L.C.

(57) ABSTRACT

In example embodiments, a semiconductor light emitting device includes a light emitting structure, first and second insulating layers, a barrier metal layer, and an electrode. The light emitting structure includes an active layer between a first and second conductivity-type semiconductor layer. The first insulating layer is on the light emitting structure and defines a first one and a second one of first openings that respectively expose the first and second conductivity-type semiconductor layers. The barrier metal layer is on the first insulating layer and electrically connected to the first and second conductivity-type semiconductor layers through the first and second one of the first openings. The second insulating layer is on the barrier metal layer and defines a second opening that partially exposes the barrier metal layer. The electrode is on the barrier metal layer and electrically connected to the first and second conductivity-type semiconductor layers through the barrier metal layer.

20 Claims, 35 Drawing Sheets

(56) References Cited

U.S. PATENT DOCUMENTS

| | | |
|---|---|---|
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,393,344 B2 | 3/2013 | Hunnicutt |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2007/0102815 A1 | 5/2007 | Kaufmann et al. |
| 2008/0136019 A1 | 6/2008 | Johnson et al. |
| 2009/0014869 A1 | 1/2009 | Vrtis et al. |
| 2012/0248605 A1 | 10/2012 | Yamaguchi |
| 2013/0147034 A1 | 6/2013 | Chen |

FOREIGN PATENT DOCUMENTS

| | | |
|---|---|---|
| KR | 20050090188 A | 9/2005 |
| KR | 101007135 B1 | 1/2011 |

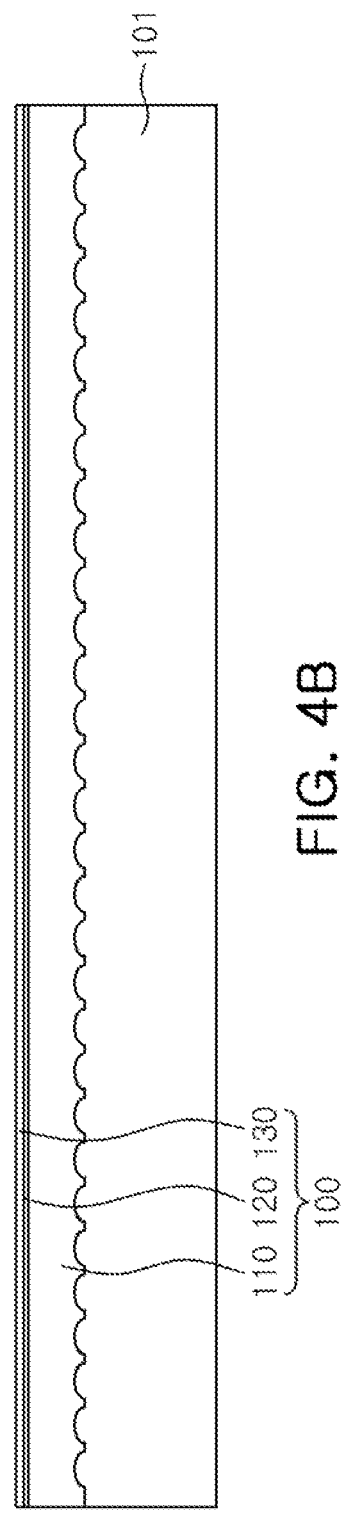

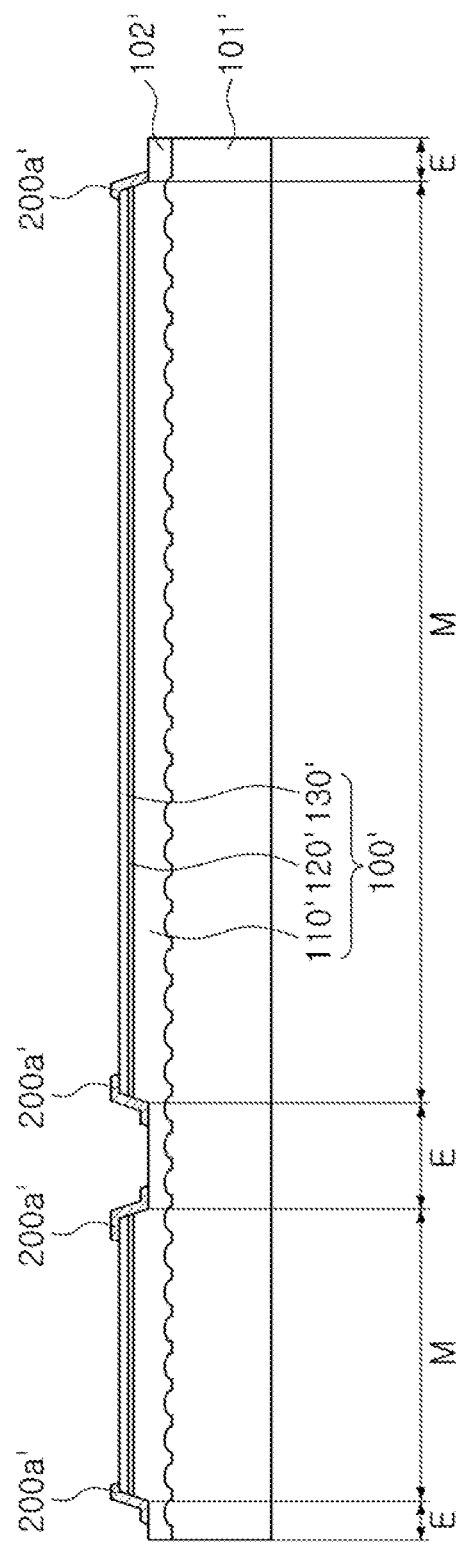

SEMICONDUCTOR LIGHT EMITTING DEVICE AND SEMICONDUCTOR LIGHT EMITTING APPARATUS HAVING THE SAME

CROSS-REFERENCE TO RELATED APPLICATION

This application claims priority under 35 U.S.C. §119 to Korean Patent Application No. 10-2013-0157164 filed on Dec. 17, 2013 and No. 10-2014-0099816 filed on Aug. 4, 2014, with the Korean Intellectual Property Office, the entire disclosure of each of which is incorporated herein by reference.

BACKGROUND

The present disclosure relates to a semiconductor lighting device and a semiconductor lighting apparatus having the same.

Light emitting diodes (LEDs) having advantages such as long lifespans, low power consumption, fast response speeds, environmental friendliness, and the like, as compared to related art light sources. LEDs have been considered as next-generation light sources. LEDs may be used as light sources in various products such as lighting devices and the backlights of display devices.

Among LEDs, a flipchip type LED may use an alloy containing a relatively high-priced metal as a bonding metal, such as AuSn, or the like. The high-priced metal may increase costs. Also, since the metal may be melted at a high temperature, a relatively high-priced package formed of a material that has a coefficient of thermal expansion appropriate for high temperature bonding conditions and which is not deformed at high temperatures may be needed, which can reduce utilization coverage.

Also, in the case of use of Sn solder, the solder may be spread.

SUMMARY

Example embodiments relate to a method for limiting and/or preventing spreading of Sn solder.

However, features and/or aspects of example embodiments are not limited thereto and aspects, features, and/or effects that may be recognized from example embodiments described hereinafter may also be included although not explicitly mentioned.

According to example embodiments, a semiconductor light emitting device may include: a light emitting structure, a first insulating layer, a barrier metal layer, a second insulating layer, and an electrode. The light emitting structure includes a first conductivity-type semiconductor layer, an active layer on the first conductivity-type semiconductor layer, and a second conductivity-type semiconductor layer on the active layer. The first insulating layer is on the light emitting structure. The first insulating layer defines a plurality of first openings. A first one of the plurality of first openings exposes the first conductivity-type semiconductor layer. A second one of the plurality of first openings exposes the second conductivity-type semiconductor layer. The barrier metal layer is on the first insulating layer. The barrier metal layer is electrically connected to the first conductivity-type semiconductor layer and the second conductivity-type semiconductor layer through the first one and the second one of the plurality of first openings. The second insulating layer is on the barrier metal layer. The second insulating layer defines a second opening that partially exposes the barrier metal layer. The electrode is on the barrier metal layer. The electrode is electrically connected to the first conductivity-type semiconductor layer and the second conductivity-type semiconductor layer through the barrier metal layer and the second opening. At least one of the first and second insulating layers and the barrier metal layer are between the electrode and the light emitting structure.

In example embodiments, at least part of the second insulating layer may be over a portion of the barrier metal layer in the first one and the second one of the plurality of first openings.

In example embodiments, the plurality of first openings and the second opening may be disposed so they do not overlap with each other.

In example embodiments, the light emitting structure may include a plurality of mesa regions demarcated by an etched region. The etched region may be defined by a trench in the second conductivity-type semiconductor layer, the active layer, and the first conductivity-type semiconductor layer.

In example embodiments, the etched region may extend from one side of the light emitting structure to an other side of the light emitting structure that is opposite the one side. The etched region may be one of a plurality of etched regions that are parallel to each other.

In example embodiments, the semiconductor light emitting device may further include a first contact electrode on an upper surface of the first conductivity-type semiconductor layer exposed by the etched region. The first contact electrode may be connected to the first conductivity-type semiconductor layer. The first contact electrode may be connected to the electrode through the barrier metal layer.

In example embodiments, the first contact electrode may include a plurality of pad portions and a plurality of finger portions. The plurality of finger portions respectively may extend from the plurality of pad portions in the etched region.

In example embodiments, the plurality of pad portions may be directly connected to the barrier metal layer.

In example embodiments, the semiconductor light emitting device may further include: a second contact electrode on an upper surface of the plurality of mesa regions. The second contact electrode may be connected to the second conductivity-type semiconductor layer. The second contact electrode may be connected to the electrode through the barrier metal layer.

In example embodiments, the second contact electrode may include a reflective metal layer.

In example embodiments, the second contact electrode may further include a coating metal layer on the reflective metal layer.

In example embodiments, the semiconductor light emitting device may further include a passivation layer on a lateral surface of the mesa region. The passivation layer may cover a part of the active layer exposed by the etched region.

In example embodiments, the electrode may include at least one first electrode and at least one second electrode.

According to example embodiments, a semiconductor light emitting device may include: a light emitting structure, a first insulating layer, a barrier metal layer, a second insulating layer, and an electrode. The light emitting structure is a stacked structure of a first conductivity-type semiconductor layer, an active layer on the first conductivity-type semiconductor layer, and a second conductivity-type semiconductor layer on the active layer. The light emitting structure includes a mesa region partially demarcated by an etched region. The etched region is defined by a trench in the second conductivity-type semiconductor layer, the active layer, and the first conductivity-type semiconductor layer. The first insulating layer is on the light emitting structure. The barrier metal layer is on the first insulating layer. The barrier metal layer penetrates through the first insulating layer and is electrically connected to the first conductivity-type semiconductor layer and the second conductivity-type semiconductor layer. The second insulating layer is on the barrier metal layer. The electrode is on a portion of the barrier metal layer exposed from the second insulating layer. The electrode is electrically connected to the first conductivity-type semiconductor layer and the second conductivity-type semiconductor layer through the barrier metal layer. The electrode is over the light emitting structure. The first insulating layer and the barrier metal layer or the barrier metal layer and the second insulating layer are between the electrode and the light emitting structure.

In example embodiments, the first insulating layer may define a plurality of first openings. A first one of the plurality of first openings may expose the first conductivity-type semiconductor layer. A second one of the plurality of first openings may expose the second conductivity-type semiconductor layer. The second insulating layer may define a second opening that partially exposing the barrier metal layer. The plurality of first openings and the second opening may be disposed so as not to overlap with each other.

According to example embodiments, a semiconductor light emitting device includes a light emitting structure, a dual-barrier structure on the light emitting structure, a second insulating layer on the dual-barrier structure, and an electrode on the dual-barrier structure and at least part of the second insulating layer. The dual-barrier structure includes a barrier metal layer on a first insulating layer. The first insulating layer defines openings that expose a first portion and a second portion, respectively, of the light emitting structure. The barrier metal layer includes a first barrier metal layer and a second barrier metal layer that are electrically connected to the first portion and the second portion, respectively, of the light emitting structure through different ones of the openings defined by the first insulating layer. The second insulating layer defines at least one opening that exposes the first barrier metal layer and at least one opening that exposes the second barrier metal layer. The barrier metal layer and least one of the first and second insulating layers are between the electrode and the light emitting structure.

In example embodiments, the light emitting structure may include a first conductivity type semiconductor layer, an active layer on the first conductivity type semiconductor layer, and a second conductivity-type semiconductor layer on the active layer. The first conductivity-type semiconductor layer and the second conductivity-type semiconductor layer may be different conductivity types. The light emitting structure may include a mesa region demarcated by a trench that extends through the active layer and the second conductivity-type semiconductor layer to the first conductivity-type semiconductor layer. The electrode may include at least one first electrode that is spaced apart from at least one second electrode. The first portion of the light emitting structure may be an area of the first conductivity-type semiconductor layer that is exposed by the trench. The at least one first electrode may be electrically connected to the first portion the light emitting structure through the first barrier metal layer. The second portion of the light emitting structure may be an area of the second conductivity-type semiconductor layer that is exposed by at least one of the openings defined by the first insulating layer. The at least one second electrode may be electrically connected to the second portion of the light emitting structure through the second barrier metal layer.

In example embodiments, the second insulating layer may extend over the openings defined by the first insulating layer.

In example embodiments, the openings defined by the first insulating layer may be formed so they do not overlap with the at least one opening that exposes the first barrier metal layer and the at least one opening that exposes the second barrier metal layer defined by the second insulating layer.

In example embodiments, a passivation layer may cover a lateral surface of the trench.

BRIEF DESCRIPTION OF DRAWINGS

The above and other aspects, features and other advantages will be more clearly understood from the following detailed description of non-limiting embodiments, taken in conjunction with the accompanying drawings, in which like reference characters refer to like parts throughout the different views. The drawings are not necessarily to scale, emphasis instead being placed upon illustrating principles of inventive concepts. In the drawings:

FIGS. 4A through 10B are views schematically illustrating major processes of a method for manufacturing a semiconductor light emitting device according to example embodiments;

DETAILED DESCRIPTION

Figure 1:
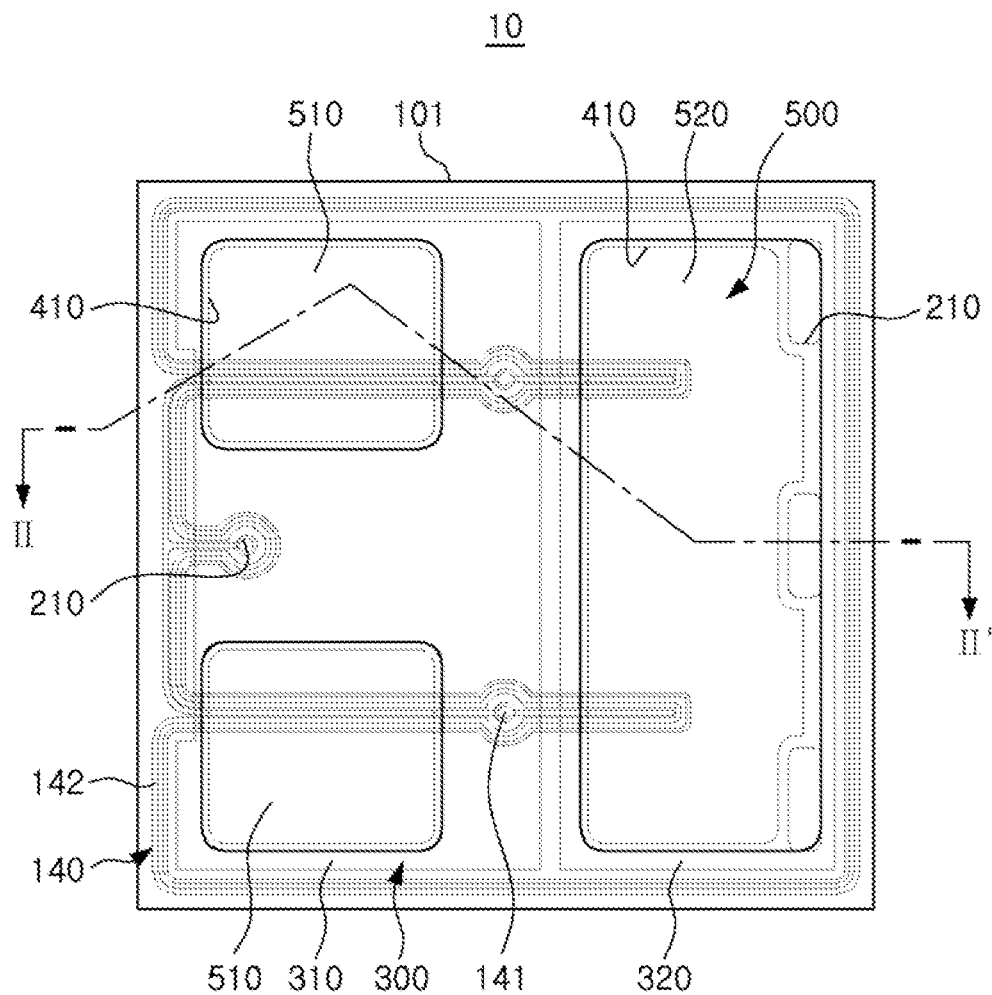
FIG. 1 is a plan view schematically illustrating a semiconductor light emitting device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. Terms such as 'upper', 'upper portion', 'upper surface', 'lower', 'lower portion', 'lower surface', 'lateral surface', and the like, are determined based on the drawings, and in actuality, the terms may be changed according to a direction in which a device is disposed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A semiconductor light emitting device according to example embodiments will be described with reference to FIGS. 1 and 2. FIG. 1 is a plan view schematically illustrating a semiconductor light emitting device according to example embodiments, and FIG. 2 is a cross-sectional view taken along line II-II' in FIG. 1.

Figure 2:
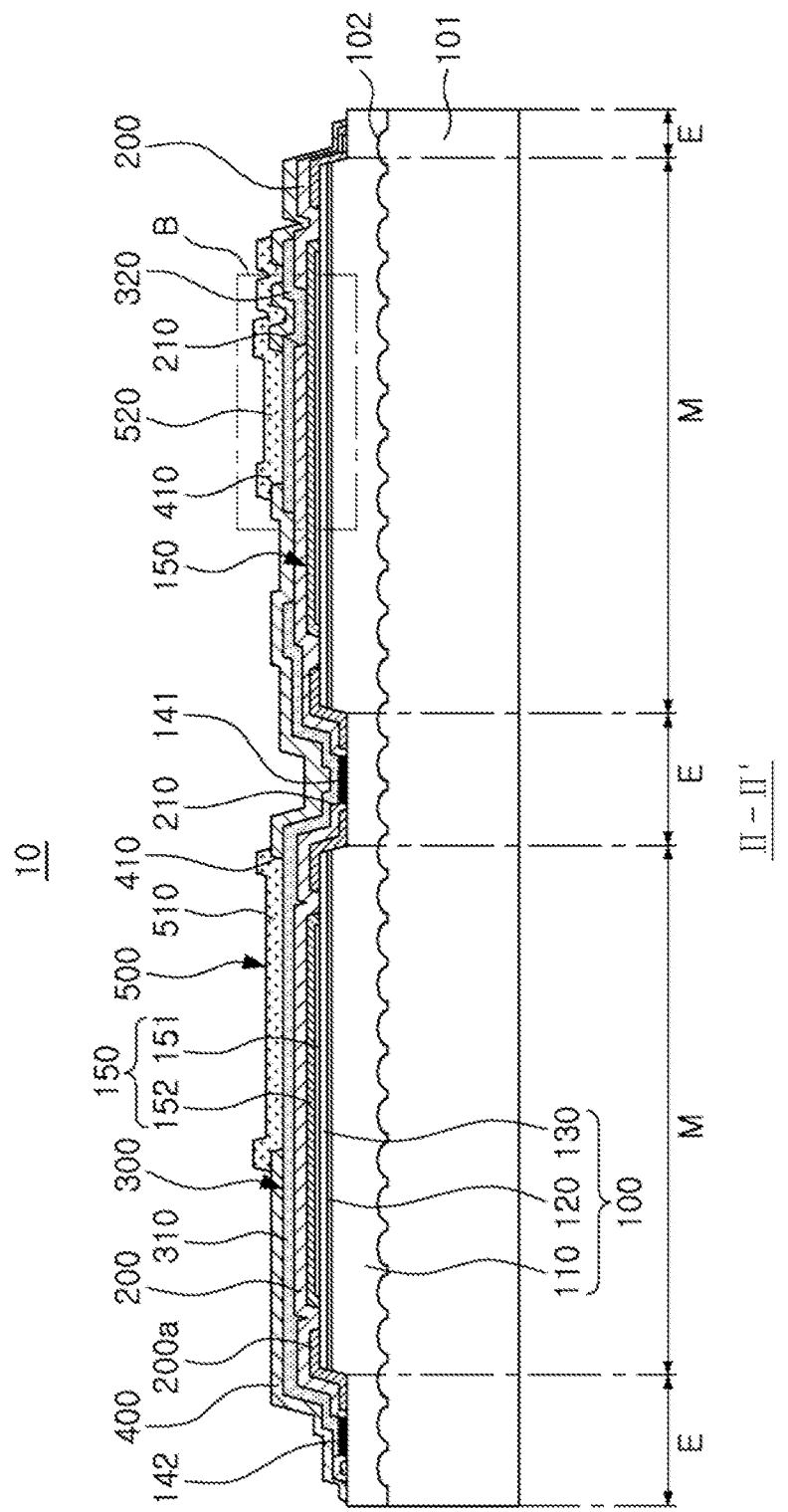
FIG. 2 is a cross-sectional view taken along line II-II' in FIG. 1.

Referring to FIGS. 1 and 2, a semiconductor light emitting device according to example embodiments may include a light emitting structure 100, a first insulating layer 200, a barrier metal layer 300, a second insulating layer 400, and an electrode 500.

The light emitting structure 100 may have a structure in which a plurality of semiconductor layers are stacked, and include a first conductivity-type semiconductor layer 110, an active layer 120, and a second conductivity-type semiconductor layer 130 sequentially stacked on a substrate 101.

The substrate 101 may have an upper surface extending in x and y directions. The x and y directions may be orthogonal to each other in a horizontal plane. The substrate 101 may be provided as a semiconductor growth substrate and may be formed of an insulating, a conductive, or a semiconductive material such as sapphire, silicon (Si), SiC, $MgAl_2O_4$, MgO, $LiAlO_2$, $LiGaO_2$, GaN, or the like. Sapphire commonly used as a material of a nitride semiconductor growth substrate is a crystal having electrical insulating properties and having Hexa-Rhombo R3c symmetry, of which lattice constants in c-axial and a-axial directions are approximately 13.001 Å and 4.758 Å, respectively, and has a C-plane (0001), an A-plane (1120), an R-plane (1102), and the like. In this case, the C-plane of sapphire crystal allows a nitride thin film to be relatively easily grown thereon and is stable at high temperatures, so the sapphire substrate is commonly used as a nitride growth substrate.

Meanwhile, as illustrated, a plurality of depression and protrusion patterns 102 may be formed on an upper surface of the substrate 101, namely, on a growth surface of the semiconductor layers, and crystallinity, light emitting efficiency, and the like, of the semiconductor layers may be enhanced by the depression and protrusion patterns 102. In example embodiments, the depression and protrusion patterns 102 are illustrated to have a dome-like convex shape, but example embodiments are not limited thereto. For example, the depression and protrusion patterns 102 may have various shapes such as a quadrangular shape, a triangular shape, and the like. Also, the depression and protrusion patterns 102 may be selectively formed and provided, and thus, the depression and protrusion patterns 102 may be omitted.

Meanwhile, the substrate 101 may be removed afterwards according to example embodiments. Namely, after the substrate 101 is provided as a growth substrate for growing the first conductivity-type semiconductor layer 110, the active layer 120, and the second conductivity-type semiconductor layer 130, the substrate 101 may be removed through a separation process. The substrate 101 may be separated from the semiconductor layers through a laser lift-off (LLO) process, a chemical lift-off (CLO) process, or the like.

Although not shown, a buffer layer may be formed on an upper surface of the substrate 101. The buffer layer, serving to alleviate a lattice defects in the semiconductor layers grown on the substrate 101, may be formed as an undoped semiconductor layer formed of a nitride, or the like. For example, the buffer layer may alleviate a difference in lattice constants between the sapphire substrate 101 and the first conductivity-type semiconductor layer 110 formed of GaN and stacked thereon to increase crystallinity of the GaN layer. In this case, undoped GaN, AlN, InGaN, or the like, may be applied as the buffer layer, and the buffer layer may be grown to have a thickness ranging from tens to hundreds of Å at a low temperature ranging from 500° C. to 600° C. Here, undoped refers to a semiconductor layer which has not been subjected to an impurity doping process. The semiconductor layer may have an inherent level of impurity concentration. For example, when a gallium nitride semiconductor is grown by using metal organic chemical vapor deposition (MOCVD) process, silicon (Si), or the like, used as a dopant, may be included in an amount ranging from about $10^{14}$ to $10^{18}/cm^3$ therein, although not intended. Here, the buffer layer is not essential in example embodiments and may be omitted according to example embodiments.

The first conductivity-type semiconductor layer 110 stacked on the substrate 101 may be formed of a semiconductor doped with an n-type impurity, and may be an n-type nitride semiconductor layer. Also, the second conductivity-type semiconductor layer 130 may be formed of a semiconductor doped with a p-type impurity and may be a p-type nitride semiconductor layer. However, according to example embodiments, the first and second conductivity-type semiconductor layers 110 and 130 may be interchanged in position so as to be stacked. The first and second conductivity-type semiconductor layers 110 and 130 may have an empirical formula $Al_xIn_yGa_{(1-x-y)}N$ (here, $0 \le x \le 1$, $0 \le y \le 1$, $0 \le x+y \le 1$), and for example, materials such as GaN, AlGaN, InGaN, AlInGaN correspond thereto.

The active layer 120 disposed between the first and second conductivity-type semiconductor layers 110 and 130 may emit light having a desired (and/or alternatively predetermined) level of energy through electron-hole recombination. The active layer 120 may include a material having an energy band gap smaller than that of the first and second conductivity-type semiconductor layers 110 and 130. For example, in a case in which the first and second conductivity-type semiconductor layers 110 and 130 are formed of a GaN-based compound semiconductor, the active layer 120 may include an InGaN-based compound semiconductor having an energy band gap smaller than that of GaN. For example, the active layer 120 may have a multi-quantum well (MQW) structure in which quantum well layers and quantum barrier layers are alternately stacked, for example, an InGaN/GaN structure. However, example embodiments are not limited thereto and the active layer 120 may have a single quantum well (SQW) structure.

The light emitting structure 100 may include an etched region E in which portions of the second conductivity-type semiconductor layer 130, the active layer 120, and the first conductivity-type semiconductor layer 110 have been etched to form a trench, and a plurality of mesa regions M partially demarcated by the etched region E. In other words, the mesa region M may be demarcated by the trench that extends through the active layer 120 and the second conductivity-type semiconductor layer 130 to the first conductivity-type semiconductor layer 110.

The etched region E may have a gap structure incised from one side of the light emitting structure 100 having a quadrangular shape to the other side of the light emitting structure 100 opposed thereto to have a desired (and/or alternatively predetermined) thickness and length, and a plurality of etched regions E may be provided to be parallel. Thus, the plurality of mesa regions M may not be physically completely separated by the etched region E and may be integrally connected to each other in the other side portions.

A first contact electrode 140 may be disposed on an upper surface of the first conductivity-type semiconductor layer 110 exposed by the etched region E, and connected to the first conductivity-type semiconductor layer 110, and a second contact electrode 150 may be disposed on an upper surface of the plurality of mesa regions M and connected to the second conductivity-type semiconductor layer 130.

As illustrated in FIG. 1, the first contact electrode 140 may include a plurality of pad portions 141 and a plurality of finger portions 142 having a width smaller than that of the pad portions 141 and extending within the etched region E. The plurality of pad portions 141 may be disposed to be spaced apart from one another, and the plurality of finger portions 142 may connect the plurality of pad portions 141.

The second contact electrode 150 may include a reflective metal layer 151. Also, the second contact electrode 150 may further include a coating metal layer 152 covering the reflective metal layer 151. However, the coating metal layer 152 may be selectively provided and may be omitted according to example embodiments. The second contact electrode 150 may be provided to cover an upper surface of the second conductivity-type semiconductor layer 130 defining an upper surface of the mesa region M.

In order to increase luminous efficiency of the light emitting structure 100, the first and second contact electrodes 140 and 150 may be disposed alternately in a zigzag manner overall. However, the shape and structure of the first and second contact electrodes 140 and 150 are merely illustrations of non-limiting examples and example embodiments are not limited thereto.

Meanwhile, in order to cover the active layer 120 exposed to the etched region E, a passivation layer 200a formed of an insulating material may be provided on a lateral surface of the mesa region M. However, the passivation layer 200a is selectively provided and may be omitted according to example embodiments.

The first insulating layer 200 may be formed on the light emitting structure 100 to cover the entirety of the light emitting structure 100. The first insulating layer 200 may basically be formed of a material having insulating properties, and may be formed of an inorganic material or an organic material. For example, the first insulating layer 200 may be formed of an epoxy-based insulating resin. Also, the first insulating layer 200 may be formed of a silicon oxide or a silicon nitride, for example, $SiO_2$, $SiN$, $SiO_xN_y$, $TiO_2$, $Si_3N_4$, $Al_2O_3$, $TiN$, $AlN$, $ZrO_2$, $TiAlN$, $TiSiN$, or the like.

The first insulating layer 200 may include a plurality of first openings 210 disposed on the first conductivity-type semiconductor layers 110 exposed to the etched region E and second conductivity-type semiconductor layers. In detail, the first opening 210 may have a structure of partially exposing the first and second contact electrodes 140 and 150 on the first and second conductivity-type semiconductor layers 110 and 130. In particular, in the case of the first contact electrode 140, the pad portion 141 is exposed outwardly through the first opening 210, and thus, the first opening 210 may be disposed in a position corresponding to the pad portion 141 on the first conductivity-type semiconductor layer 110.

The barrier metal layer 300 is provided on the first insulating layer 200, and may be electrically connected to the first and second conductivity-type semiconductor layers 110 and 130 through the first opening 210, respectively.

As illustrated in FIG. 2, the barrier metal layer 300 may be insulated from the first and second conductivity-type semiconductor layers 110 and 130 by the first insulating layer 200 covering the entirety of an upper surface of the light emitting structure 100. The barrier metal layer 300 may be connected to the first and second contact electrodes 140 and 150 exposed outwardly through the first opening 210 so as to be connected to the first and second conductivity-type semiconductor layers 110 and 130.

Electrical connection between barrier metal layer 300 and the first and second conductivity-type semiconductor layers 110 and 130 may be variously adjusted by the first opening 210 provided in the first insulating layer 200. For example, electrical connection between the barrier metal layer 300 and the first and second conductivity-type semiconductor layers 110 and 130 may be variously modified according to the number and disposition of the first openings 210.

The barrier metal layer 300 may be provided as at least a pair of layers in order to electrically insulate the first and second conductivity-type semiconductor layers 110 and 130. Namely, a first metal layer 310 may be electrically connected to the first conductivity-type semiconductor layer 110 and a second metal layer 320 may be electrically connected to the second conductivity-type semiconductor layer 130, and the first and second metal layers 310 and 320 may be separated to be electrically insulated.

The barrier metal layer 300 may be formed of a material including one or more among Au, W, Pt, Si, Ir, Ag, Cu, Ni, Ti, Cr, and an alloy thereof, for example.

The second insulating layer 400 is provided on the barrier metal layer 300 and covers the entire barrier metal layer 300 for the protection thereof. Also, the second insulating layer 400 may have a second opening 410 partially exposing the barrier metal layer 300.

A plurality of second openings 410 may be provided to partially expose the first metal layer 310 and the second metal layer 320, respectively. In this case, the second openings 410 may be disposed so as not to overlap with the first openings 210 of the first insulating layer 200. Namely, the second openings 410 are not positioned above the first openings 210 in a vertical direction.

In FIG. 1, three second openings 410 are illustrated and disposed to have an asymmetrical structure, but example embodiments are not limited thereto. The number and disposition of the second openings 410 may be variously modified.

The second insulating layer 400 may be formed of a material identical to that of the first insulating layer 200.

The electrode 500 includes a first electrode 510 and a second electrode 520 and may be provided on the first and second metal layers 310 and 320 partially exposed through the second openings 410. The electrodes 500 may be electrically connected to the first and second conductivity-type semiconductor layers 110 and 130 through the barrier metal layer 300, respectively.

The first and second electrodes 510 and 520 may be, for example, under-bump metallurgy (UBM) layers. The first and second electrodes 510 and 520 may each be provided as an individual electrode or a plurality of electrodes. In example embodiments, it is illustrated that two first electrodes 510 and an individual second electrode 520 are provided, but example embodiments are not limited thereto. The number and disposition of the first and second electrodes 510 and 520 may be adjusted by the second openings 410.

The first and second electrodes 510 and 520 may have a recess in which a conductive adhesive, for example, a Sn solder, is disposed.

Meanwhile, based on the disposition structure of the first and second openings 210 and 410, the second insulating layer 400 may be provided in a position corresponding to the first opening 210 on the barrier metal layer 300 connected to the first and second conductivity-type semiconductor layers 110 and 130 through the first opening 210.

Accordingly, the first insulating layer 200 and the barrier metal layer 300 or the barrier metal layer 300 and the second insulating layer 400 are disposed in an overlapping manner between the first and second electrodes 510 and 520 and the light emitting structure 100, forming a dual-barrier structure.

Figure 3:
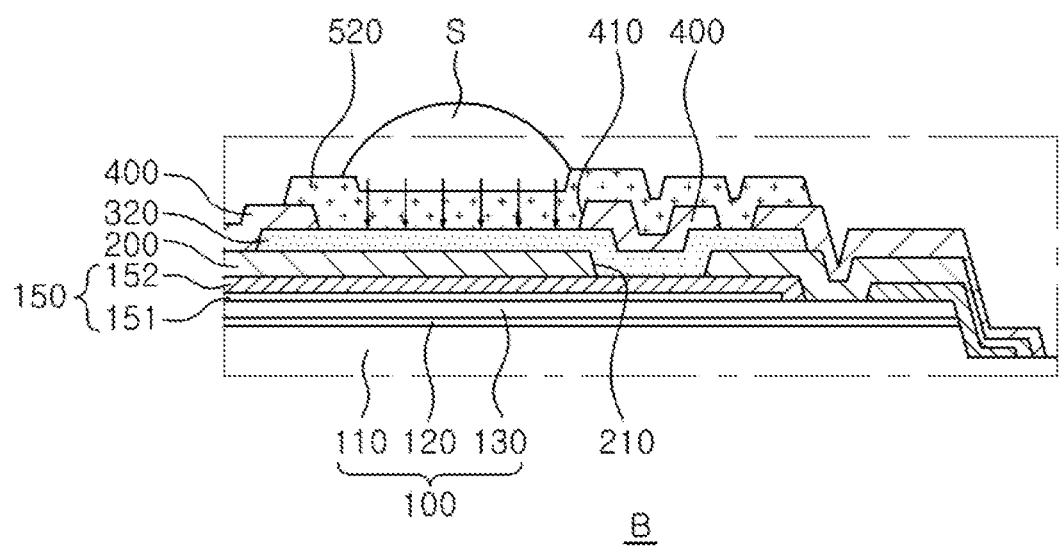
FIG. 3 is an enlarged cross-sectional view of portion 'B' in FIG. 2.

The dual-barrier structure will hereinafter be described with reference to FIG. 3. FIG. 3 is an enlarged cross-sectional view of a portion 'B' in FIG. 2.

As illustrated in FIG. 3, in a region in which the Sn solder S and the second electrode 520, namely, the UBM, are overlaid, a barrier metal layer (in detail, the second metal layer 320) and the first insulating layer 200 as an insulating dielectric material may be stacked to be disposed. The dual-barrier structure including the second metal layer 320 and the first insulating layer 200 may limit and/or prevent the Sn solder S from being spread toward the light emitting structure 100 in a vertical direction as indicated by the arrows. In detail, the Sn solder S may be blocked from being spread to the second contact electrode 150 including the reflective metal layer 151.

In detail, a Sn solder alloy SAC($Sn_{96.5}Ag_{3.0}Cu_{0.5}$) is relatively low in price and has excellent reliability, but in the related art single barrier structure, the Sn solder is spread to contaminate an electrode, degrading reflectivity and luminance in the electrode and increasing a forward voltage Vf. In example embodiments, the dual-barrier structure may limit and/or prevent the Sn solder from being spread to the light emitting structure compared to a single barrier structure. Thus, the degradation of reflectivity and luminance and the increase in the forward voltage due to contamination may be limited and/or prevented.

FIGS. 4A through 10B are views schematically illustrating major processes of a method for manufacturing a semiconductor light emitting device according to example embodiments. In FIGS. 4A through 10B, like reference numerals denote like members, and thus, redundant descriptions will be omitted.

Figure 4A:
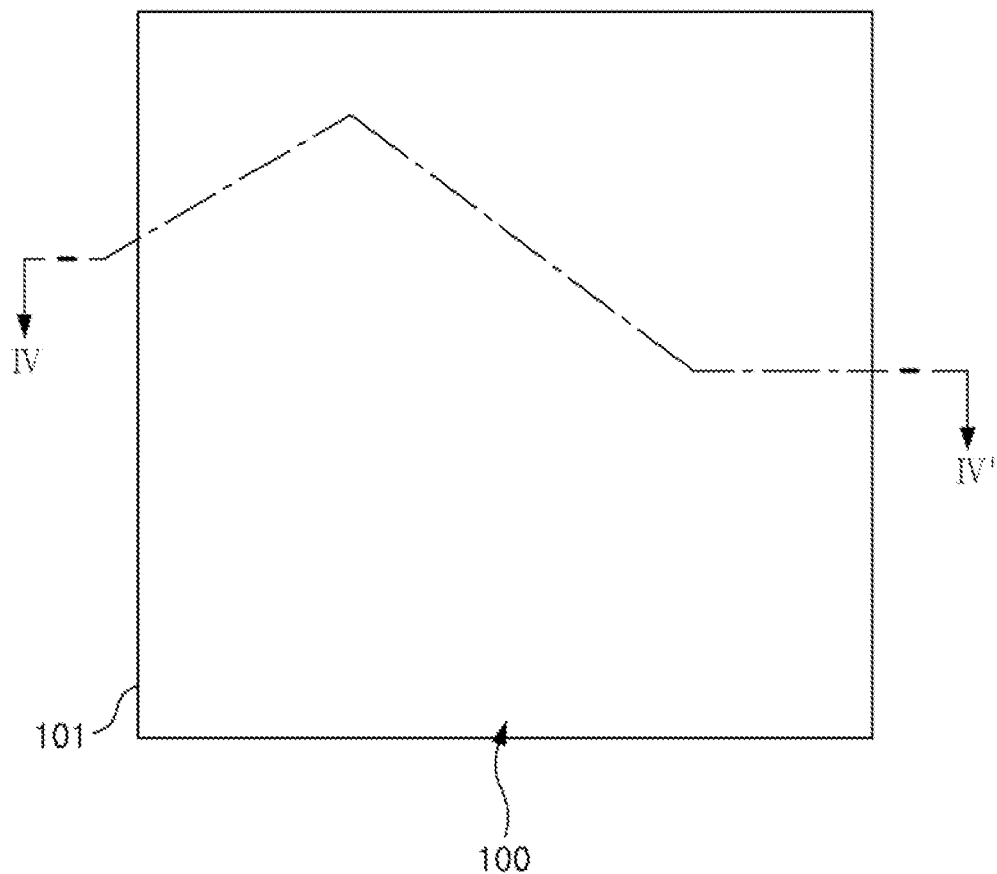

Referring to FIGS. 4A and 4B, FIG. 4A is a plan view of the light emitting structure formed on the substrate, and FIG. 4B is a cross-sectional view taken along line IV-VI' in FIG. 4A. FIGS. 5A through 10B are illustrated in the same manner.

First, depression and protrusion patterns 102 may be formed on the substrate 101. However, the depression and protrusion patterns 102 may be omitted according to example embodiments. A substrate formed of a material such as sapphire, Si, SiC, $MgAl_2O_4$, MgO, $LiAlO_2$, $LiGaO_2$, GaN, or the like, as described above may be used as the substrate 101. Although not shown, a buffer layer may be selectively provided. The buffer layer may be formed of a material such as undoped GaN, AlN, InGaN, or the like.

Next, a first conductivity-type semiconductor layer 110, an active layer 120, and a second conductivity-type semiconductor layer 130 may be sequentially grown on a substrate 101 using metal-organic chemical vapor deposition (MOCVD), hydride vapor phase epitaxy (HVPE), or molecular beam epitaxy (MBE) to form the light emitting structure 100 having a stacked structure of a plurality of semiconductor layers. Here, the first conductivity-type semiconductor layer 110 and the second conductivity-type semiconductor layer 130 may be an n-type semiconductor layer and a p-type semiconductor layer, respectively. In the light emitting structure 100, the positions of the first conductivity-type semiconductor layer 110 and the second conductivity-type semiconductor layer 130 may be interchanged, and the second conductivity-type semiconductor layer 130 may first be formed on the substrate 101.

Figure 5A:
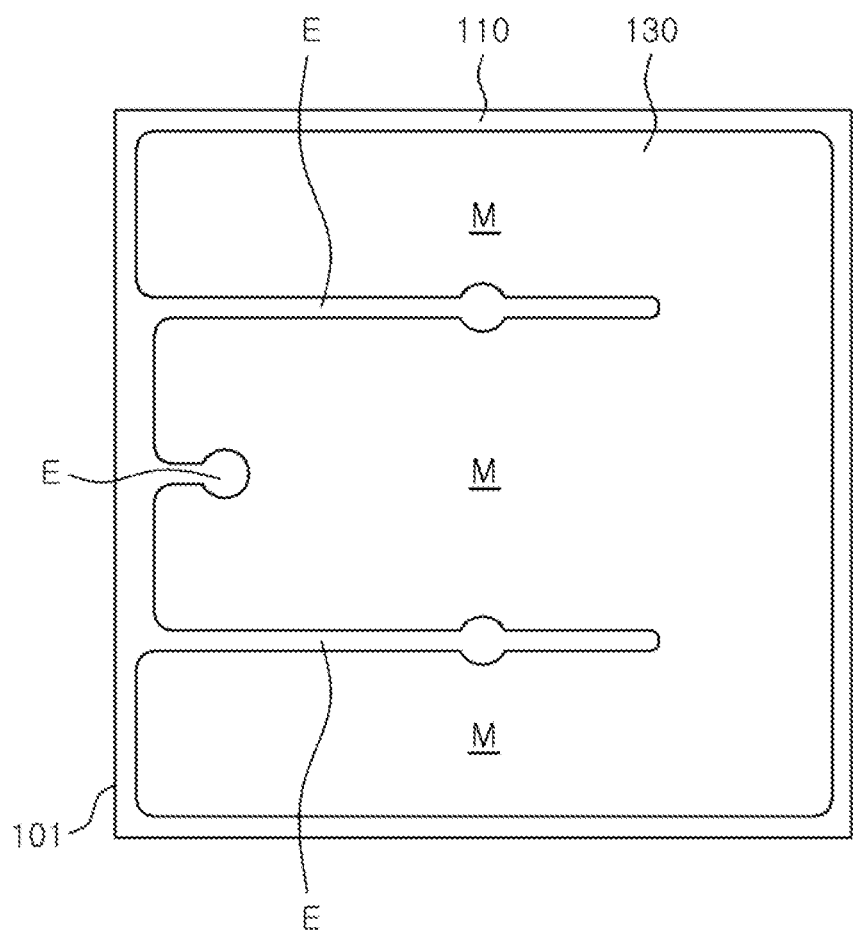
Figure 5B:
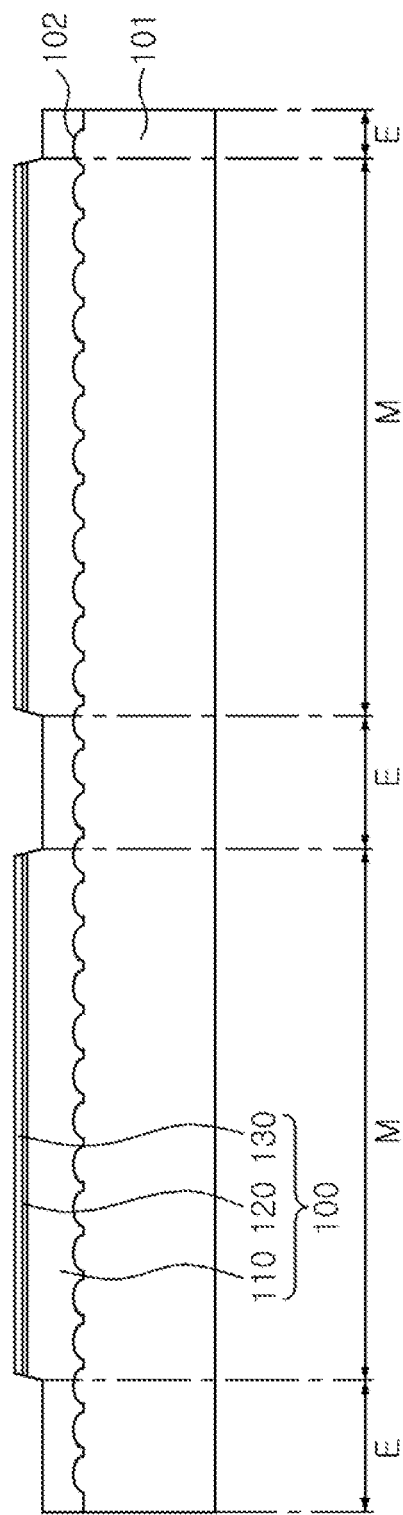

Referring to FIGS. 5A and 5B, portions of the second conductivity-type semiconductor layer 130, the active layer 120, and the first conductivity-type semiconductor layer 110 may be etched to expose at least a portion of the first conductivity-type semiconductor layer 110. Accordingly, an etched region E and a plurality of mesa regions M partially demarcated by the etched region E may be formed.

During the etching process, a mask layer may be formed in a region excluding a region in which the first conductivity-type semiconductor layer 110 is exposed, and wet etching or dry etching may subsequently be performed to form the mesa regions M. According to example embodiments, an etching process may be performed such that the first conductivity-type semiconductor layer 110 is not etched and only a portion of an upper surface thereof is exposed.

Figure 6A:
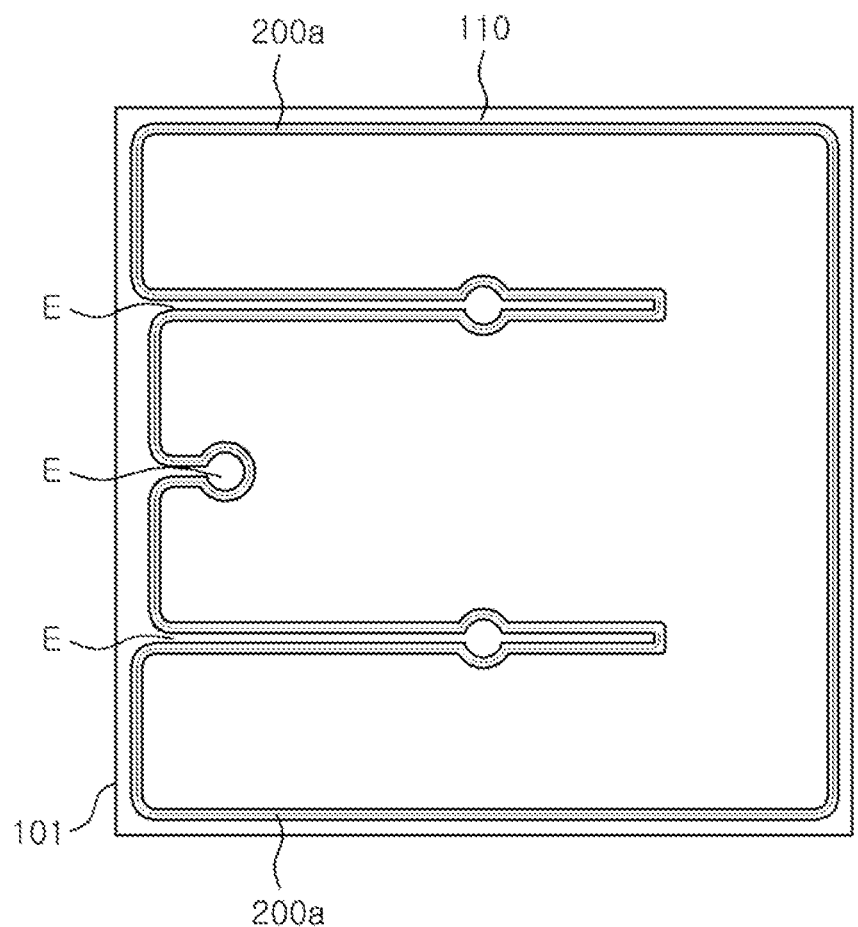
Figure 6B:
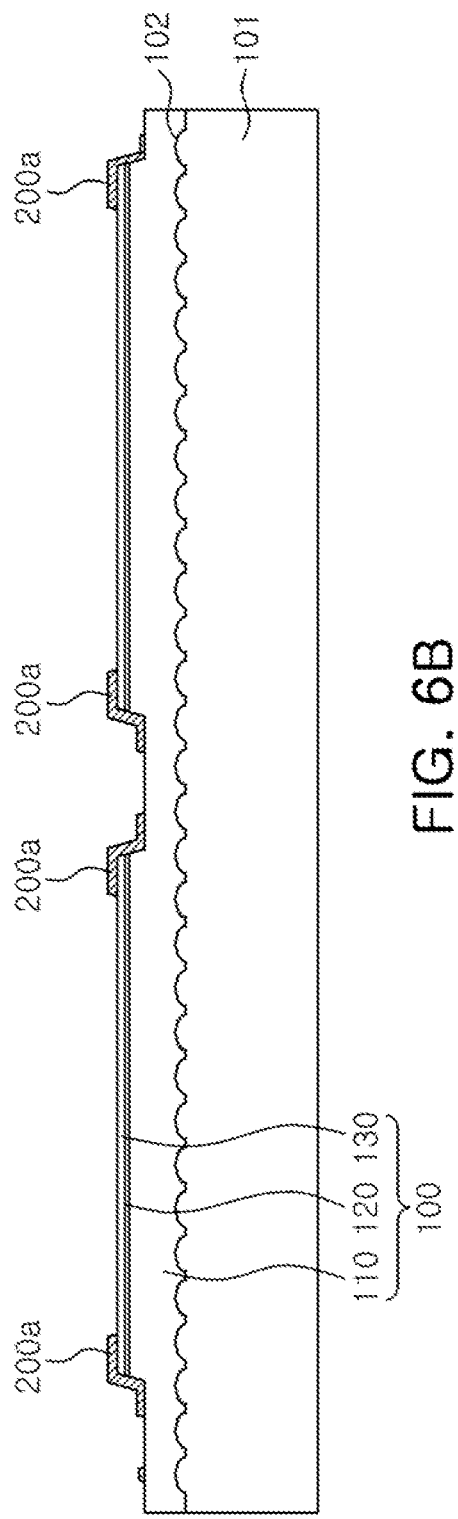

Referring to FIGS. 6A and 6B, a passivation layer 200a may be formed on a lateral surface of the mesa region M exposed to the etched region E through the etching process. The passivation layer 200a may be formed to cover the lateral surface of the mesa region M including an edge of an upper surface of the mesa region M and a portion of a bottom surface of the etched region E. Thus, the active layer 120 exposed to the etched region E may be covered by the passivation layer 200a not to be exposed outwardly. However, the passivation layer 200a is selectively formed and may be omitted according to example embodiments.

Figure 7A:
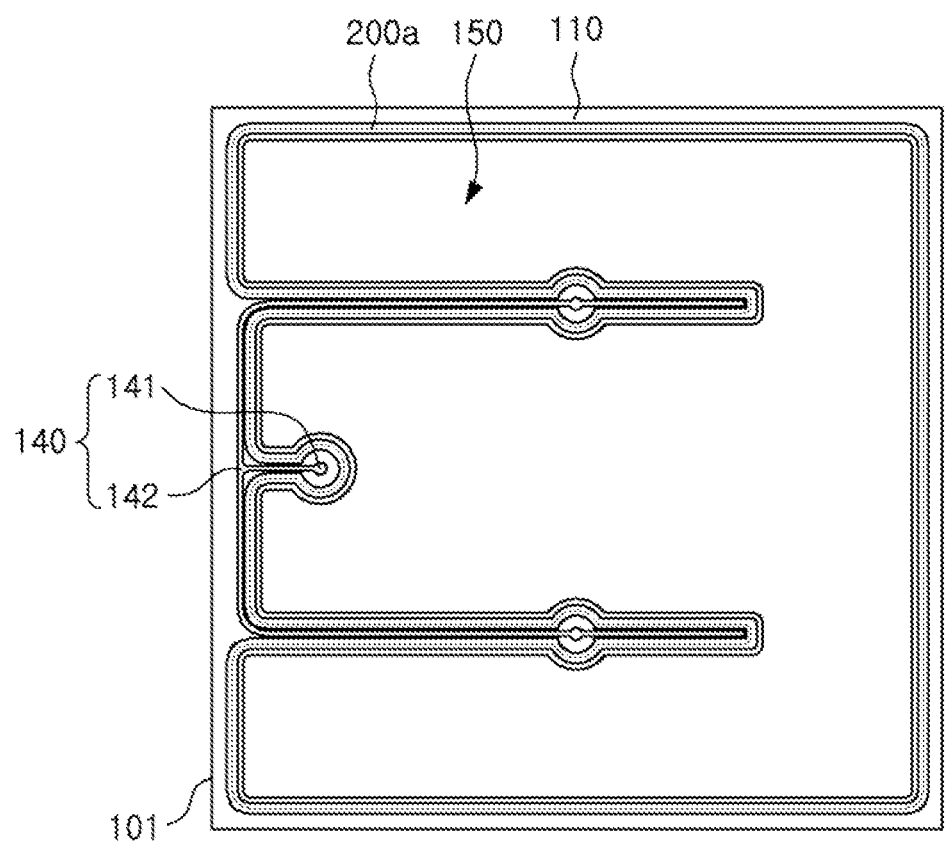
Figure 7B:
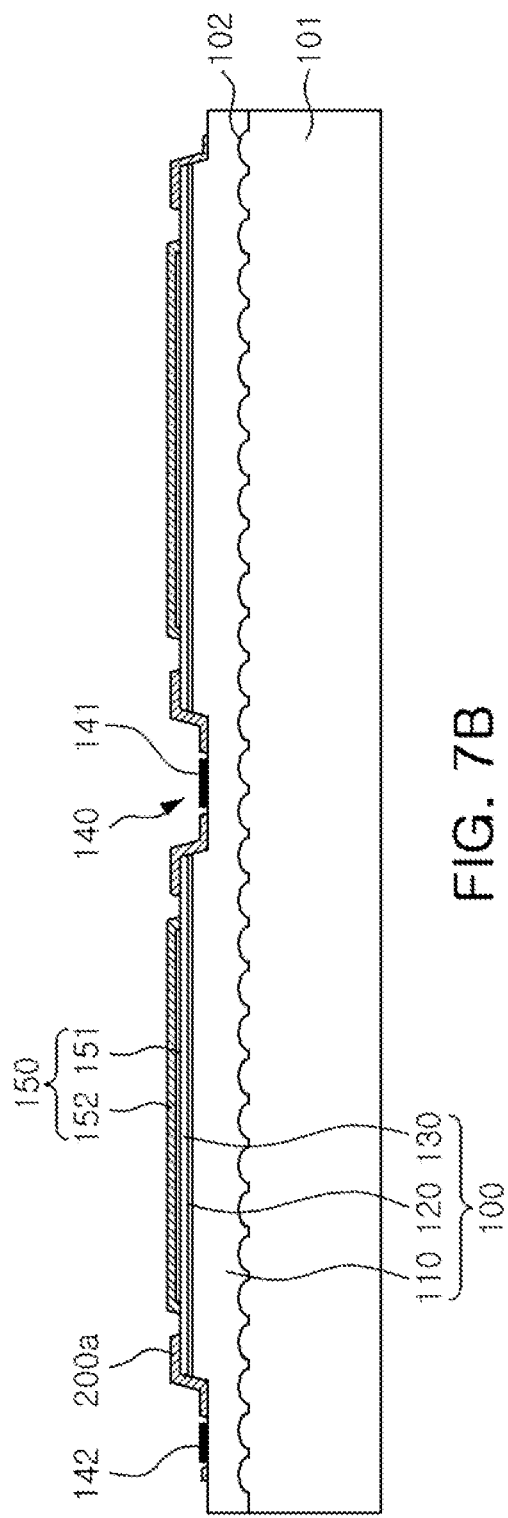

Referring to FIGS. 7A and 7B, a first contact electrode 140 and a second contact electrode 150 may be formed in the etched region E and the mesa region M, respectively. The first contact electrode 140 may be connected to the first conductivity-type semiconductor layer 110 defining a bottom surface of the etched region E along the etched region E. The second contact electrode 150 may be connected to the second conductivity-type semiconductor layer 130.

The first contact electrode 140 may include a plurality of pad portions 141 and a plurality of finger portions 142 extending from the pad portions 141. The second contact electrode 150 may include a reflective metal layer 151. The second contact electrode 150 may further include a coating metal layer 152 covering the reflective metal layer 151.

Figure 8A:
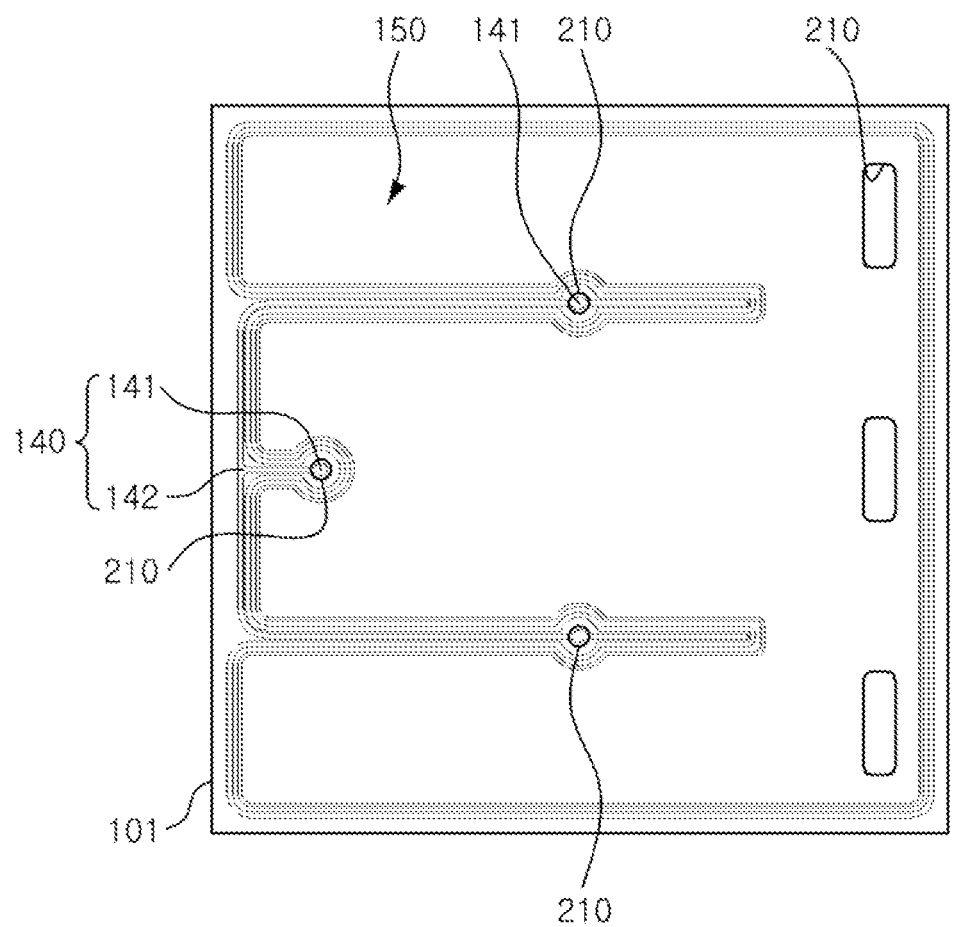
Figure 8B:
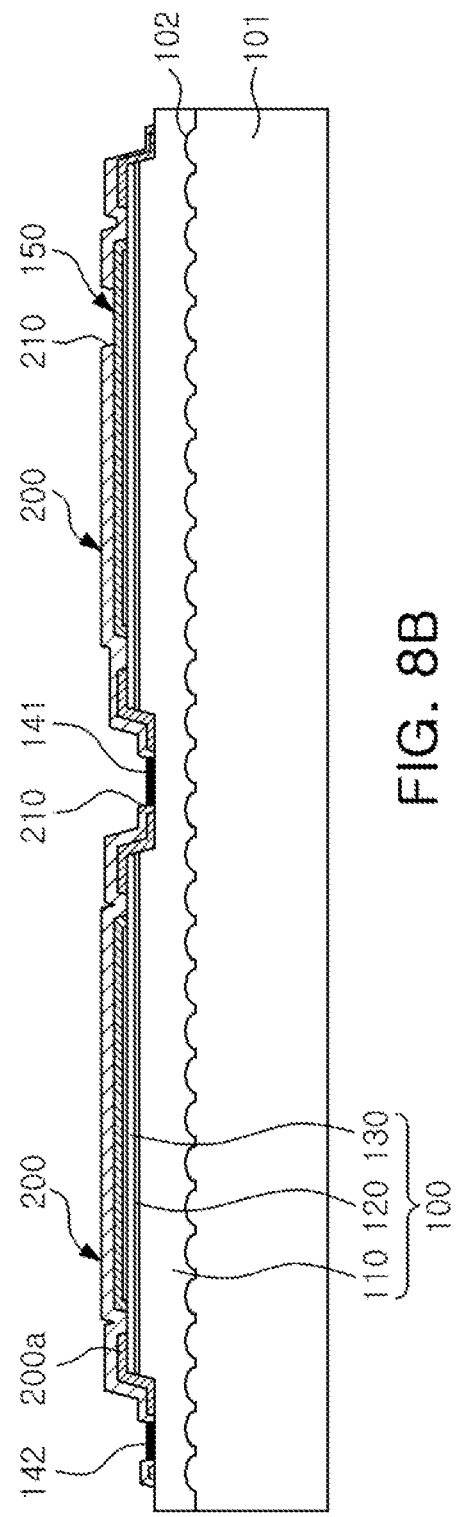

Referring to FIGS. 8A and 8B, a first insulating layer 200 may be provided on the light emitting structure 100 to cover the entirety of the light emitting structure 100. For example, the first insulating layer 200 may be formed of an epoxy-based insulating resin. Also, the first insulating layer 200 may be formed of a silicon oxide or a silicon nitride and may include, for example, $SiO_2$, SiN, $SiO_xN_y$, $TiO_2$, $Si_3N_4$, $Al_2O_3$, TiN, AlN, $ZrO_2$, TiAlN, TiSiN, or the like.

The first contact electrode 140 and the second contact electrode 150 may be partially exposed on the first and second conductivity-type semiconductor layers 110 and 130 through the plurality of first openings 210.

Figure 9A:
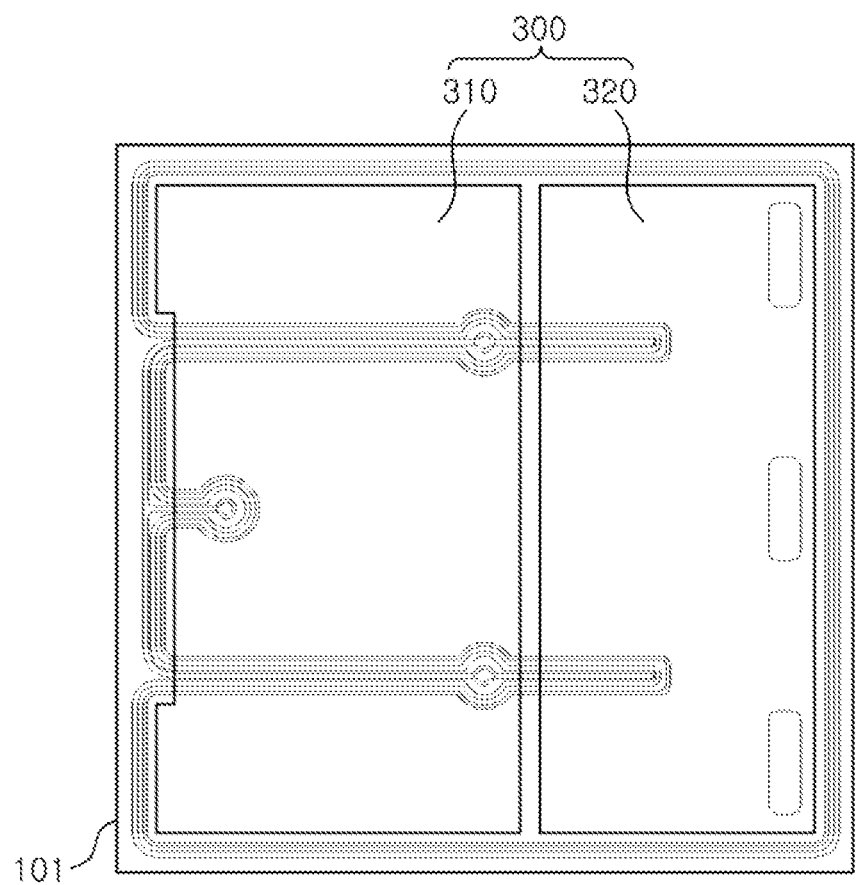
Figure 9B:
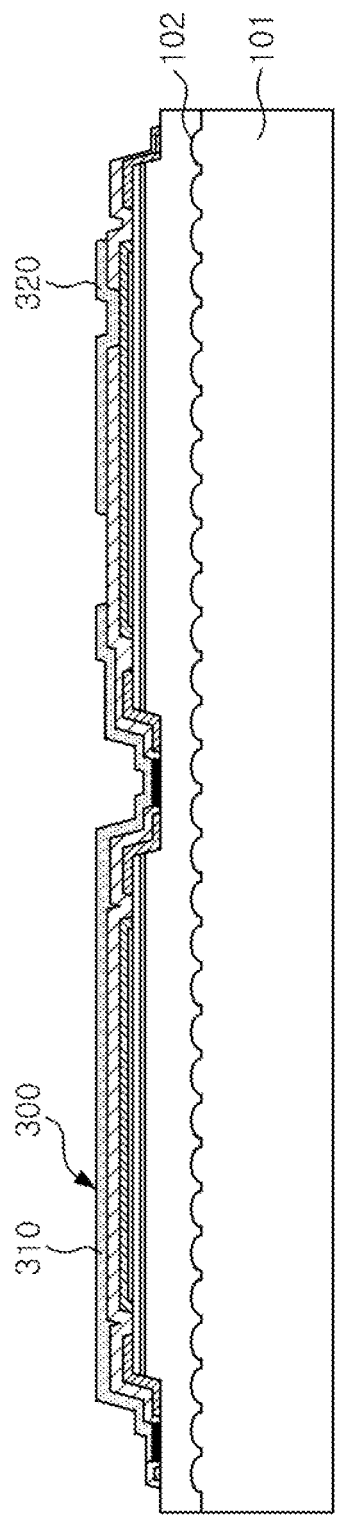

Referring to FIGS. 9A and 9B, a barrier metal layer 300 may be formed on the first insulating layer 200. The barrier metal layer 300 may be connected to the first and second contact electrodes 140 and 150 exposed through the first openings 210 so as to be electrically connected to the first conductivity-type semiconductor layer 110 and the second conductivity-type semiconductor layer 130, respectively.

The barrier metal layer 300 may be provided as at least a pair of layers in order to electrically insulate the first conductivity-type semiconductor layer 110 and the second conductivity-type semiconductor layer 130. Namely, a first metal layer 310 is electrically connected to the first conductivity-type semiconductor layer 110, a second metal layer 320 may be electrically connected to the second conductivity-type semiconductor layer 130, and the first and second metal layers 310 and 320 may be separated to be electrically insulated.

Figure 10A:
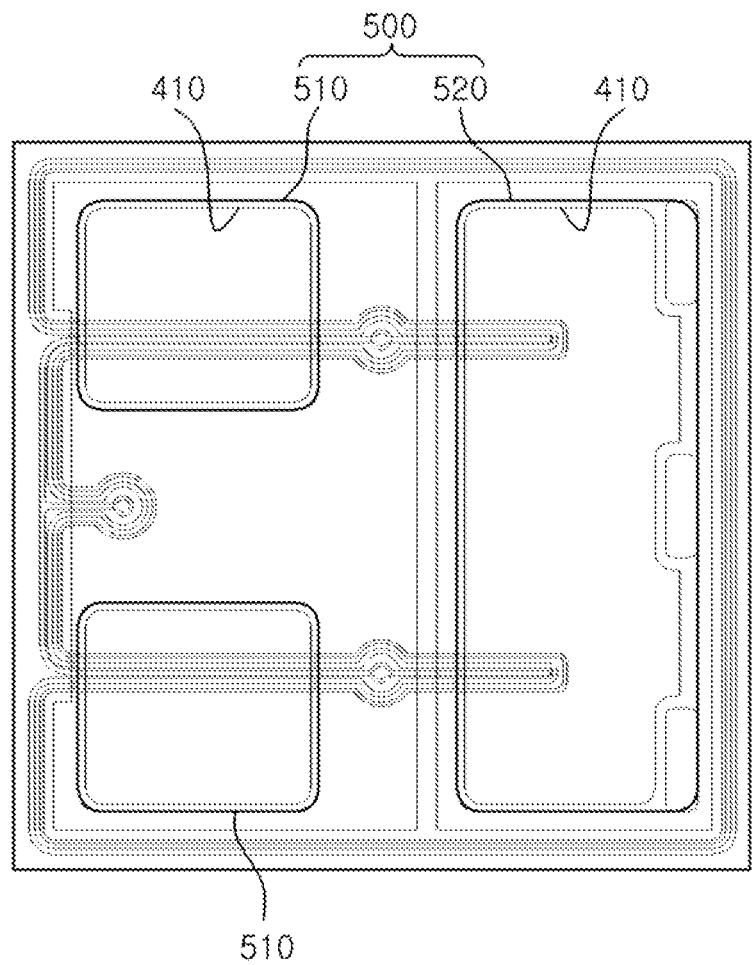
Figure 10B:
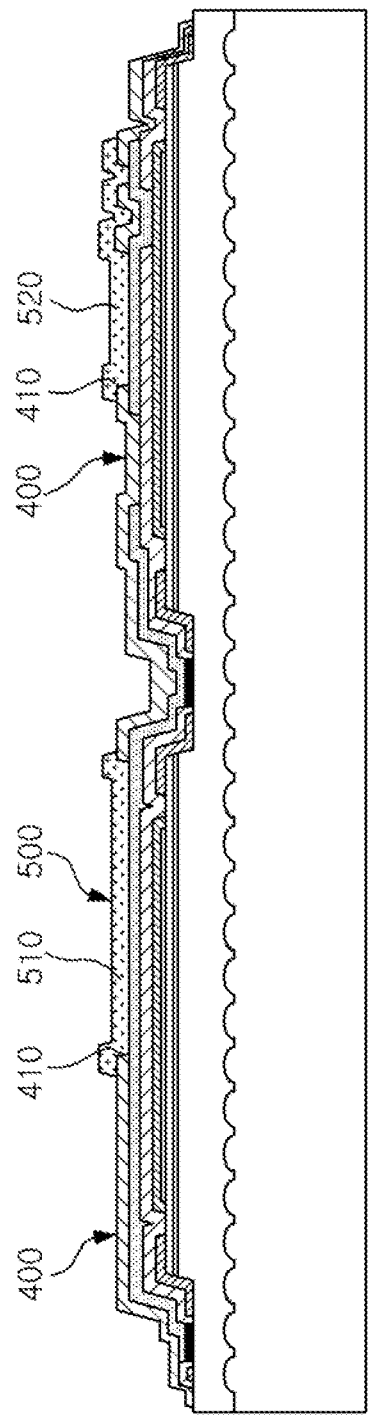

Referring to FIGS. 10A and 10B, a second insulating layer 400 may be formed on the barrier metal layer 300. The second insulating layer 400 may partially expose the barrier metal layer 300 through the second opening 410.

The second opening 410 may be provided in plural to partially expose the first metal layer 310 and the second metal layer 320, respectively, and may be disposed so as not to overlap with the first openings 210 of the first insulating layer 200. Namely, the second openings 410 are not positioned above the first openings 210. The second insulating layer 400 may be formed of a material identical to that of the first insulating layer 200.

Meanwhile, an electrode 500 including a first electrode 510 and a second electrode 520 may be formed on the first and second metal layers 310 and 320 partially exposed through the second openings 410, respectively. The first electrode 510 and the second electrode 520 may be, for example, under-bump metallurgy (UBM) layers.

Figure 11A:
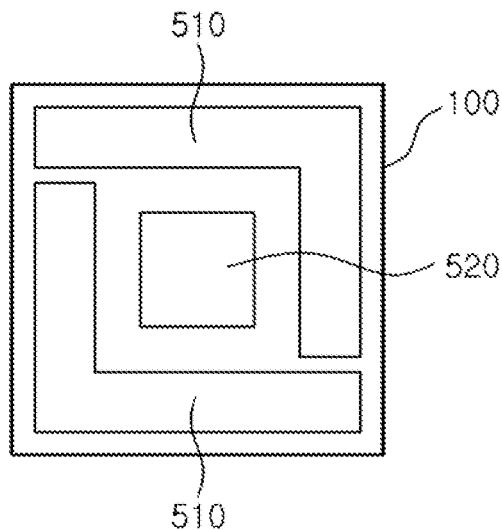
FIGS. 11A and 11B are plan views schematically illustrating a modified layout structures of first and second electrodes according to example embodiments.
Figure 11B:
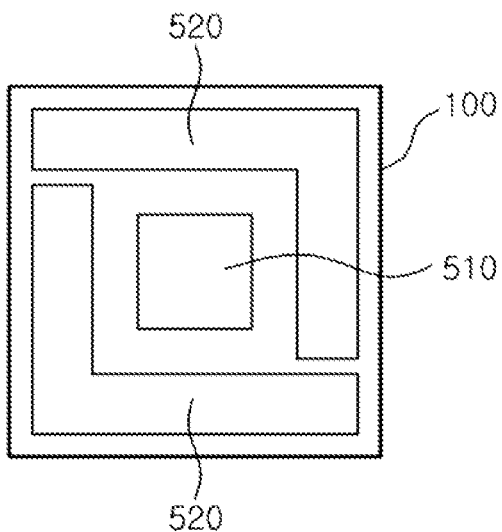

A number and a disposition structure of the first electrode 510 and the second electrode 520 may be variously adjusted. FIGS. 11A and 11B are plan views schematically illustrating modified layout structures of the first and second electrodes 510 and 520 according to example embodiments.

As illustrated in FIG. 11A, the first electrodes 510 may be disposed in an annular shape in the edge regions of the light emitting structure, and a second electrode 520 may be disposed in a central region thereof. Also, as illustrated in FIG. 11B, the first electrodes 510 and the second electrode 520 may be provided in a layout structure opposite to those of FIG. 11A.

In this manner, the layout structure in which the first electrodes surround the central second electrode has an advantage in that there is no need to install a semiconductor light emitting device limitedly only in a particular direction in consideration of positions of electrodes. For example, in installing a semiconductor light emitting device, there is no need to consider whether horizontal positions of first and second electrodes are interchanged, whether they are rotated at a certain angle, or the like, and thus, a semiconductor light emitting device may be easily installed.

Figure 12:
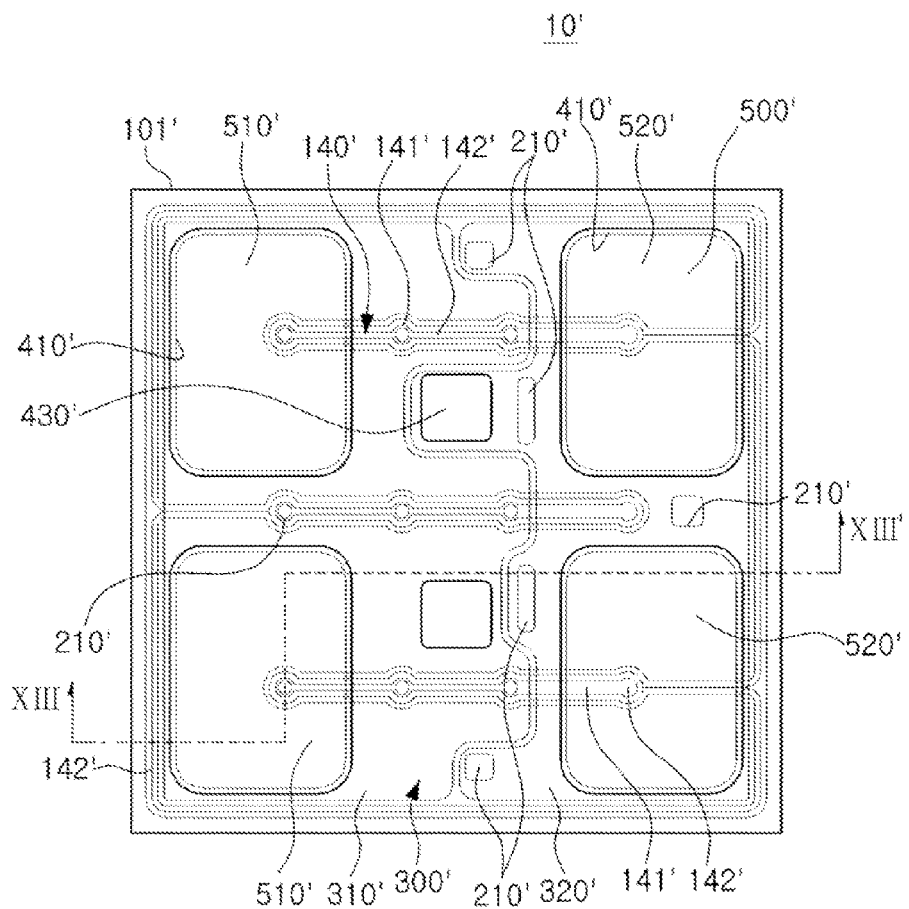
FIG. 12 is a schematic plan view of a semiconductor light emitting device according to example embodiments.

A semiconductor light emitting device according to example embodiments will be described with reference to FIGS. 12 and 13. FIG. 12 is a schematic plan view of a semiconductor light emitting device according to example embodiments, while FIG. 13 is a cross-sectional view taken along line XIII-XIII' of FIG. 12.

Figure 13:
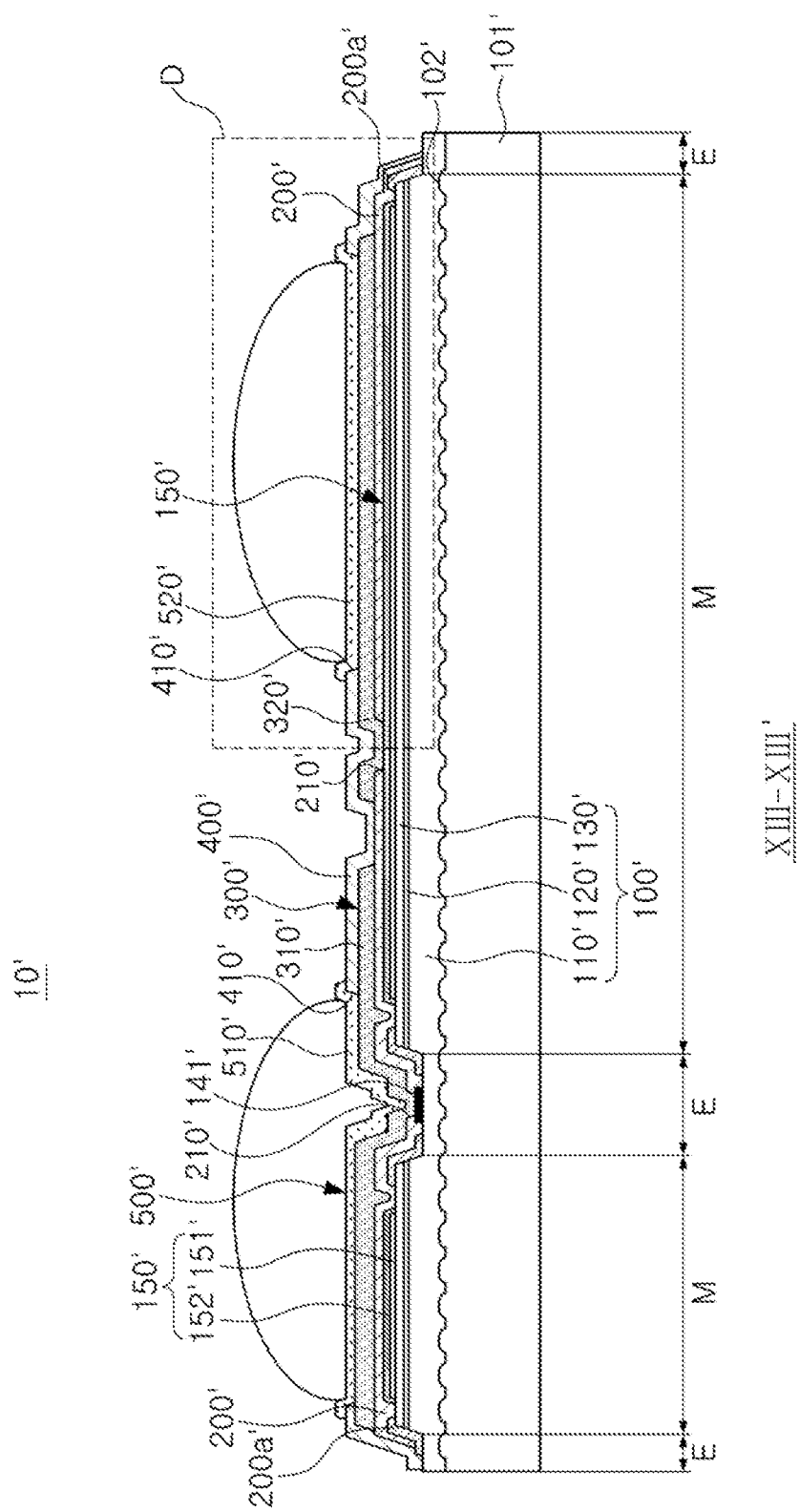
FIG. 13 is a cross-sectional view taken along line C-C' of FIG. 12.

Referring to FIGS. 12 and 13, a semiconductor light emitting device 10' according to example embodiments may include a light emitting structure 100', a first insulating layer 200', a barrier metal layer 300', a second insulating layer 400', and an electrode 500'.

The light emitting structure 100' may have a structure in which a plurality of semiconductor layers are stacked, and include a first conductivity-type semiconductor layer 110', an active layer 120', and a second conductivity-type semiconductor layer 130' sequentially stacked on a substrate 101'.

The substrate 101' and the first conductivity-type semiconductor layer 110', the active layer 120', and the second conductivity-type semiconductor layer 130' stacked on the substrate 101', forming the light emitting structure 100' according to example embodiments, have a configuration and structure corresponding to those of the substrate 101, the first conductivity-type semiconductor layer 110, the active layer 120, and the second conductivity-type semiconductor layer 130 forming the light emitting structure 100 illustrated in FIGS. 1 through 11, and thus, detailed descriptions thereof will be omitted.

The light emitting structure 100' may include an etched region E in which portions of the second conductivity-type semiconductor layer 130', the active layer 120', and the first conductivity-type semiconductor layer 110' have been etched, and a plurality of mesa regions M partially demarcated by the etched region E.

The etched region E may have a gap structure separated from one side of the light emitting structure 100' having a quadrangular shape when viewed from above to the other side of the light emitting structure 100' opposed thereto to have a desired (and/or alternatively predetermined) thickness and length, and a plurality of etched regions E may be provided to be parallel at an inner side of the quadrangular region of the light emitting structure 100'. Thus, the plurality of etched regions E may be surrounded by the mesa regions M.

A first contact electrode 140' may be disposed on an upper surface of the first conductivity-type semiconductor layer 110' exposed by the etched region E, and connected to the first conductivity-type semiconductor layer 110', and a second contact electrode 150' may be disposed on an upper surface of each of the plurality of mesa regions M and connected to the second conductivity-type semiconductor layer 130'.

As illustrated in FIG. 12, the first contact electrode 140' includes a plurality of pad portions 141' and a plurality of finger portions 142' having a width smaller than that of the pad portions 141' and extending within the etched region E. The plurality of pad portions 141' may be separately disposed, and the plurality of finger portions 142' may connect the plurality of pad portions 141'. A plurality of first contact electrodes 140' may be arranged at intervals so as to be evenly distributed overall on the first conductivity-type semiconductor layer 110'. Thus, a current may be evenly injected into the entirety of the first conductivity-type semiconductor layer 110' through the plurality of first contact electrodes 140'.

The plurality of pad portions 141' may be disposed to be spaced apart from one another, and the plurality of finger portions 142' may connect the plurality of pad portions 141'. The plurality of finger portions 142' may have different widths. For example, when the first contact electrode 140' has three finger portions 142' as in example embodiments, a width of any one of the finger portions 142' may be greater than those of the other finger portions 142'. In this case, the widths of the finger portions 142' may be adjusted in consideration of resistance of a current injected through the first contract electrode 140'.

The second contact electrode 150' may include a reflective metal layer 151'. Also, the second contact electrode 150' may further include a coating metal layer 152' covering the reflective metal layer 151'. However, the coating metal layer 152' may be selectively provided and may be omitted according to example embodiments. The second contact electrode 150' may be provided to cover an upper surface of the second conductivity-type semiconductor layer 130' defining an upper surface of the mesa region M.

Meanwhile, in order to cover the active layer 120' exposed to the etched region E, a passivation layer 200a' formed of an insulating material may be provided on a lateral surface the mesa region M. However, the passivation layer 200a' is selectively provided and may be omitted according to example embodiments.

The first insulating layer 200' may be formed on the light emitting structure 100' to cover the entirety of the light emitting structure 100'. The first insulating layer 200' may basically be formed of a material having insulating properties, and may be formed of an inorganic material or an organic material. For example, the first insulating layer 200' may be formed of an epoxy-based insulating resin. Also, the first insulating layer 200' may be formed of a silicon oxide or a silicon nitride and may include, for example, $SiO_2$, SiN, $SiO_xN_y$, $TiO_2$, $Si_3N_4$, $Al_2O_3$, TiN, AlN, $ZrO_2$, TiAlN, TiSiN, or the like.

The first insulating layer 200' may include a plurality of first openings 210' disposed on first contact electrode 140' and the second contact electrode 150', respectively. In detail, the plurality of first openings 210' may be provided in positions corresponding to the first contact electrode 140' and the second contact electrode 150', partially exposing the first and second contact electrodes 140' and 150'.

In particular, among the plurality of first openings 210', the first opening 210' disposed on the first contact electrode 140' may only expose the pad portion 141' of the first contact electrode 140' outwardly. Thus, the plurality of first openings 210' may be disposed in positions corresponding to the pad portions 141' on the first contact electrode 140'.

The barrier metal layer 300' may be provided on the first insulating layer 200' and may be electrically connected to the first conductivity-type semiconductor layer 110' and the second conductivity-type semiconductor layer 130' through the plurality of openings 210'.

As illustrated in FIG. 13, the barrier metal layer 300' may be insulated from the first and second conductivity-type semiconductor layers 110' and 130' by the first insulating layer 200' covering the entirety of an upper surface of the light emitting structure 100'. The barrier metal layer 300' may be connected to the first contact electrode 140' and the second contact electrode 150' exposed outwardly through the plurality of first openings 210' so as to be connected to the first and second conductivity-type semiconductor layers 110' and 130'.

Electrical connections between barrier metal layer 300' and the first and second conductivity-type semiconductor layers 110' and 130' may be variously adjusted by the plurality of first openings 210' provided in the first insulating layer 200'. For example, electrical connection between the barrier metal layer 300' and the first and second conductivity-type semiconductor layers 110' and 130' may be variously modified according to the number and disposition of the plurality of first openings 210'.

The barrier metal layer 300' may be provided as at least a pair of layers, including a first metal layer 310' and a second metal layer 320'. Namely, the first metal layer 310' may be electrically connected to the first conductivity-type semiconductor layer 110' through the first contact electrode 140' and the second metal layer 320' may be electrically connected to the second conductivity-type semiconductor layer 130' through the second contact electrode 150'. In this case, the first opening 210' exposing the first contact electrode 140' may need to be disposed in a position overlapping with the first metal layer 310', and the first opening 210 exposing the second contact electrode 150' may need to be disposed in a position overlapping with the second metal layer 320'. The first and second metal layers 310' and 320' may be separated to be electrically insulated.

The barrier metal layer 300' may be formed of a material including one or more among Au, W, Pt, Si, Ir, Ag, Cu, Ni, Ti, Cr, and an alloy thereof, for example.

Meanwhile, among the first contact electrodes 140', the first contact electrode 140' disposed in a position overlapping with the second metal layer 320' as the second metal layer 320' is positioned above the first contact electrode 140' may need to be limited and/or prevented from being electrically connected with the second metal layer 320'. To this end, the first insulating layer 200' may not have the first opening 210', which exposes the pad portion 141' of the first contact electrode 140', in the portion below the second metal layer 320'.

In detail, as illustrated in FIG. 12, in the case in which the first contact electrode 140' includes four pad portions 141' and three finger portions 142', the first openings 210' exposing the pad portions 141', the first openings 210' exposing the pad portions 141' are provided only on the three pad portions 141' disposed in positions overlapping with the first metal layer 310' and may not be provided on the remainder of the pad portion 141' disposed in the position overlapping with the second metal layer 320'. Thus, the pad portion 141' of the first contact electrode 140' positioned below the first metal layer 310' is connected to the first metal layer 310' through the first opening 210', but since the first opening 210' is not provided in the pad portion 141' positioned below the second metal layer 320', the pad portion 141' and the second metal layer 320' may be electrically insulated from each other. As a result, through the arrangement structure of the plurality of first openings 210' partially exposing the first contact electrode 140' and the second contact electrode 150', respectively, the first metal layer 310' may be connected to the first contact electrode 140' and the second metal layer 320' may be connected to the second contact electrode 150'.

The second insulating layer 400' may be provided on the barrier metal layer 300' and covers the entire barrier metal layer 300' for the protection thereof. The second insulating layer 400' may have a second opening 410' partially exposing the barrier metal layer 300'.

Figure 14:
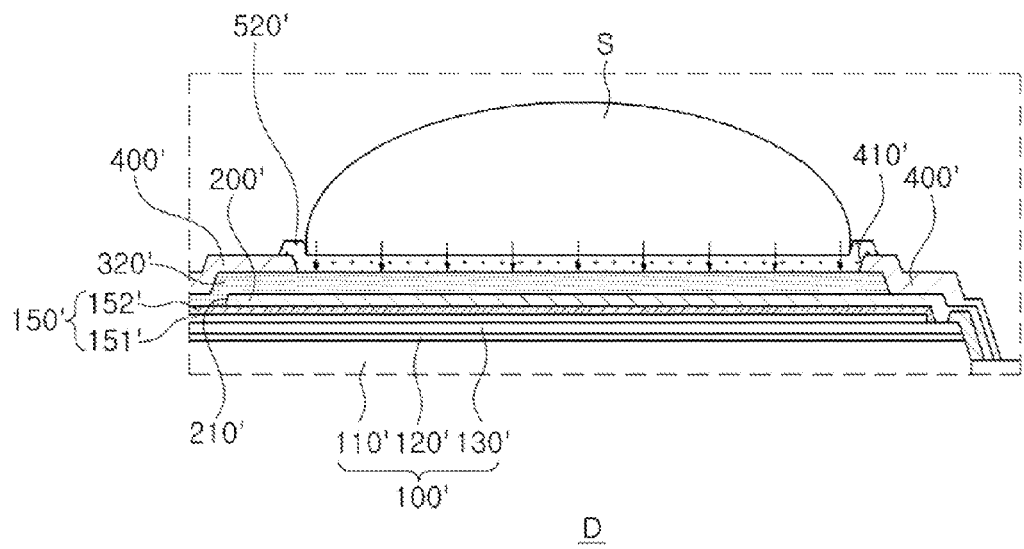
FIG. 14 is an enlarged cross-sectional view of portion 'D' of FIG. 13.

A plurality of second openings 410' may be provided to partially expose the first metal layer 310' and the second metal layer 320', respectively. In this case, a portion of the plurality of second openings 410' may be disposed so as not to overlap with a portion of the plurality of first openings 210' of the first insulating layer 200'. For example, as illustrated in FIGS. 13 and 14, the second opening 410' partially exposing the second metal layer 320', among the plurality of second openings 410', may not overlap with the first opening 210' partially exposing the second contact electrode 150', among the plurality of first openings 210'. Namely, the second openings 410' are not positioned above the first openings 210' in a vertical direction. Moreover, the second opening 410' partially exposing the first metal layer 310' may partially overlap with the first opening 210' partially exposing the first contact electrode 140'.

In example embodiments, four second openings 410' are provided and disposed to have a symmetrical structure, but example embodiments are not limited thereto. The number and disposition of the second openings 410' may be variously modified.

The second insulating layer 400' may be formed of a material identical to that of the first insulating layer 200'.

Like the second opening 410', the second insulating layer 400' may further include an open region 430' partially exposing the first and second metal layers 310' and 320'. The open region 430' may be provided as a region to be connected to a probe pin (not shown) in order to check whether a semiconductor light emitting device operates before it is installed.

The electrodes 500' includes a first electrode 510' and a second electrode 520' and may be connected to the first and second metal layers 310' and 320' partially exposed through the second openings 410', respectively. The electrodes 500' may be electrically connected to the first and second conductivity-type semiconductor layers 110' an 130' through the barrier metal layer 300', respectively.

The first and second electrodes 510' and 520' may be, for example, under-bump metallurgy (UBM) layers. The first and second electrodes 510' and 520' may each be provided as an individual electrode or a plurality of electrodes. In example embodiments, it is illustrated that two first electrodes 510' and two second electrodes 520' are provided, but example embodiments are not limited thereto. The number and disposition of the first and second electrodes 510' and 520' may be adjusted by the second openings 410'.

The first and second electrodes 510' and 520' may have a recess in which a conductive adhesive, for example, a Sn solder, is disposed.

Meanwhile, the second electrode 520' may be provided in the second opening 410' partially exposing the second metal layer 320'. Since the second opening 410' does not overlap with the first opening 210', the first insulating layer 200' together with the second metal layer 320' may be positioned below the second electrode 520'.

Accordingly, a dual-barrier structure in which the first insulating layer 200' and the barrier metal layer 300' overlaps with each other may be provided between the second electrode 520' and the light emitting structure 100'.

The dual-barrier structure will be described with reference to FIG. 14. FIG. 14 is an enlarged cross-sectional view illustrating a portion 'D' of FIG. 13.

As illustrated in FIG. 14, in a region in which the Sn solder S and the second electrode 520', namely, the UBM, are overlaid, a barrier metal layer (specifically, the second metal layer 320') and the first insulating layer 200' as an insulating dielectric material may be stacked to be disposed. The dual-barrier structure including the second metal layer 320' and the first insulating layer 200' may limit and/or prevent the Sn solder S from being spread toward the light emitting structure 100' in a vertical direction as indicated by the arrows. In detail, the Sn solder S may be blocked from being spread to the second contact electrode 150' including the reflective metal layer 151'.

FIGS. 15A through 20B are views schematically illustrating major processes of a method for manufacturing a semiconductor light emitting device according to example embodiments. In FIGS. 15A through 20B, reference numerals identical to those of FIGS. 12 through 14 denote the like members, and thus, redundant descriptions will be omitted.

Figure 15A:
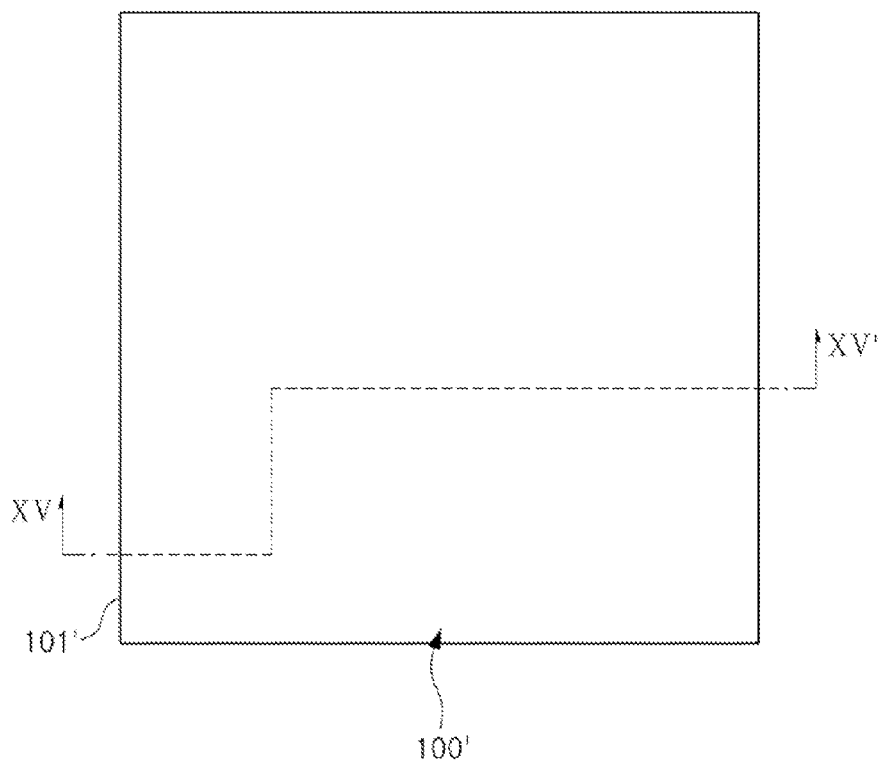
FIGS. 15A through 20B are views schematically illustrating major processes in a method of manufacturing a semiconductor light emitting device according to example embodiments.
Figure 15B:
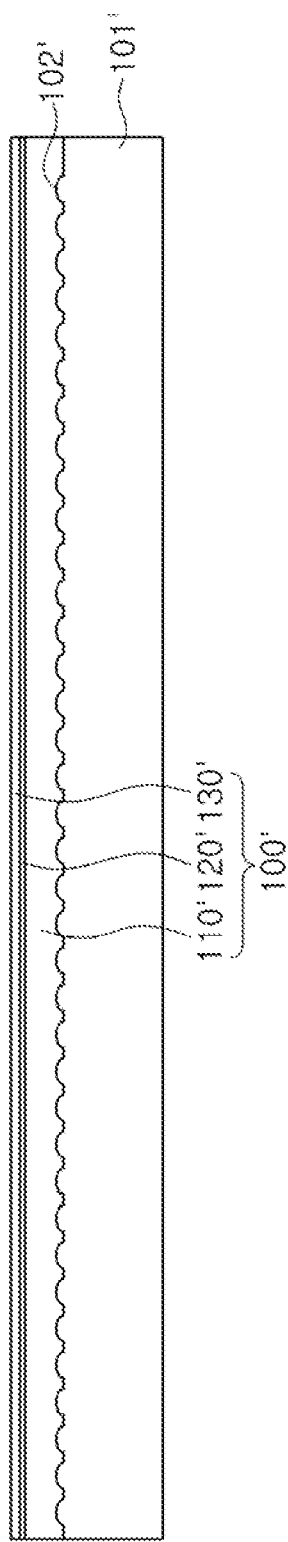

Referring to FIGS. 15A and 15B, FIG. 15A is a plan view of the light emitting structure formed on the substrate, and FIG. 15B is a cross-sectional view taken along line XV-XV' of FIG. 15A. FIGS. 16A through 20B are illustrated in the same manner.

First, depression and protrusion patterns 102' may be formed on the substrate 101'. However, the depression and protrusion patterns 102' may be omitted according to example embodiments. A substrate formed of a material such as sapphire, Si, SiC, $MgAl_2O_4$, MgO, $LiAlO_2$, $LiGaO_2$, GaN, or the like, as described above may be used as the substrate 101'.

Next, a first conductivity-type semiconductor layer 110', an active layer 120', and a second conductivity-type semiconductor layer 130' may be sequentially grown on a substrate 101' using metal-organic chemical vapor deposition (MOCVD), hydride vapor phase epitaxy (HVPE), or molecular beam epitaxy (MBE) to form the light emitting structure 100' having a stacked structure of a plurality of semiconductor layers. Here, the first conductivity-type semiconductor layer 110' and the second conductivity-type semiconductor layer 130' may be an n-type semiconductor layer and a p-type semiconductor layer, respectively. In the light emitting structure 100', the positions of the first conductivity-type semiconductor layer 110' and the second conductivity-type semiconductor layer 130' may be interchanged, and the second conductivity-type semiconductor layer 130' may first be formed on the substrate 101.'

Figure 16A:
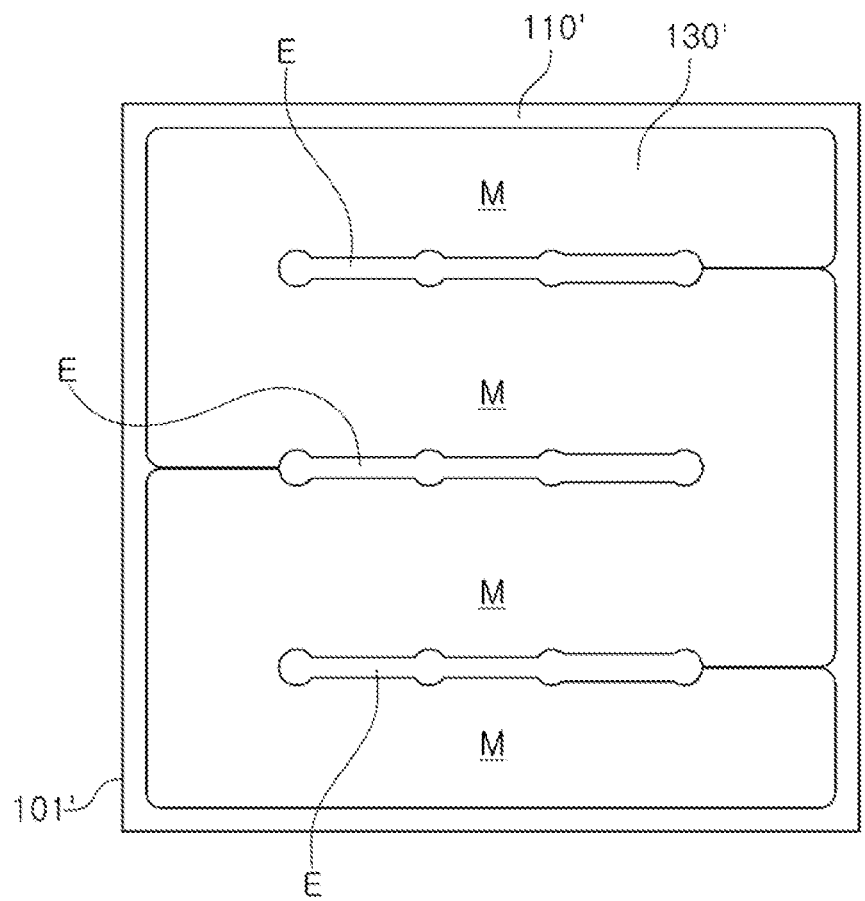

Referring to FIGS. 16A and 16B, portions of the second conductivity-type semiconductor layer 130', the active layer 120', and the first conductivity-type semiconductor layer 110' may be etched to expose at least a portion of the first conductivity-type semiconductor layer 110'. Accordingly, an etched region E and a plurality of mesa regions M partially demarcated by the etched region E may be formed.

During the etching process, a mask layer may be formed in a region excluding a region in which the first conductivity-type semiconductor layer 110' is exposed, and wet etching or dry etching may subsequently be performed to form the mesa regions M. According to example embodiments, an etching process may be performed such that the first conductivity-type semiconductor layer 110' is not etched and only a portion of an upper surface thereof is exposed.

A passivation layer 200a' may further be formed on a lateral surface of the mesa region M exposed to the etched region E through the etching process. The passivation layer 200a' may be formed to cover the lateral surface of the mesa region M including an edge of an upper surface of the mesa region M and a portion of a bottom surface of the etched region E. Thus, the active layer 120' exposed to the etched region E may be covered by the passivation layer 200a' so as not to be exposed outwardly. However, the passivation layer 200a' is selectively formed and may be omitted according to example embodiments.

Figure 17A:
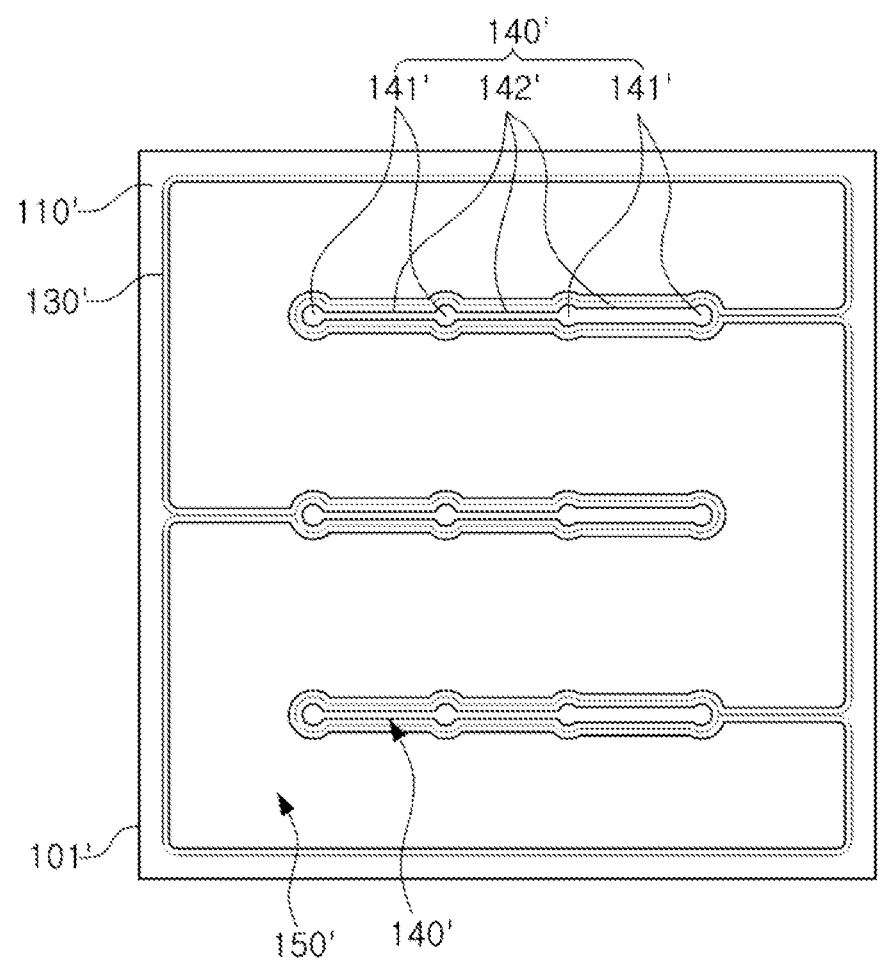
Figure 17B:
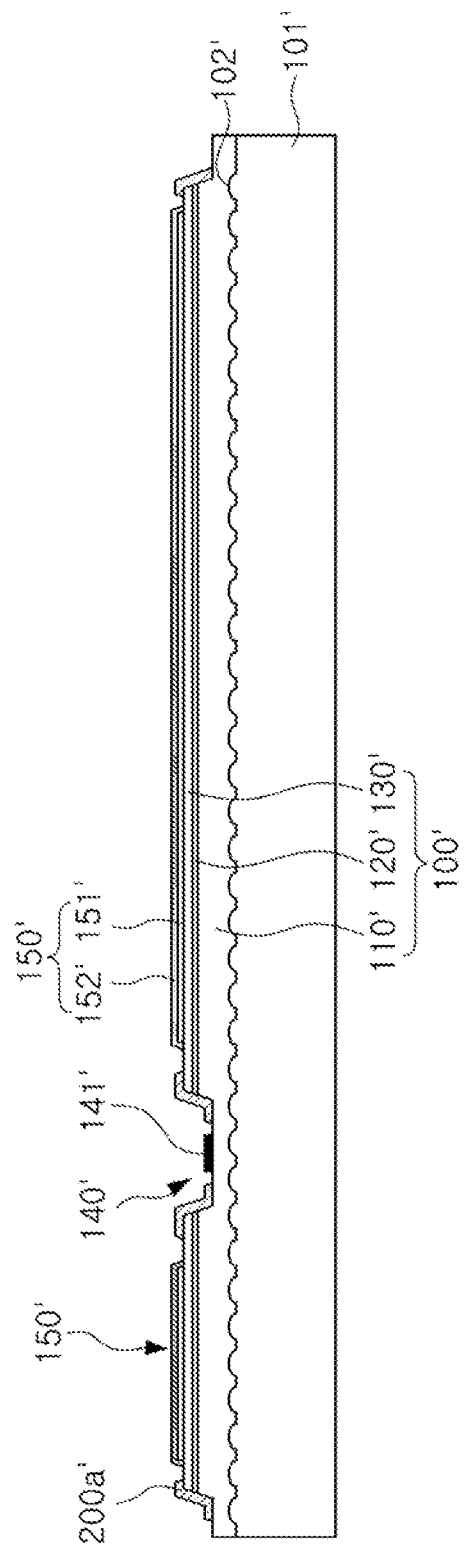

Referring to FIGS. 17A and 17B, a first contact electrode 140' and a second contact electrode 150' may be formed in the etched region E and the mesa region M, respectively. The first contact electrode 140' may extend along the etched region E and may be connected to the first conductivity-type semiconductor layer 110' defining a bottom surface of the etched region E. The second contact electrode 150' may be connected to the second conductivity-type semiconductor layer 130'.

The first contact electrode 140' may include a plurality of pad portions 141' and a plurality of finger portions 142' extending from the pad portions 141'. The second contact electrode 150' may include a reflective metal layer 151'. The second contact electrode 150' may further include a coating metal layer 152' covering the reflective metal layer 151'.

Figure 18A:
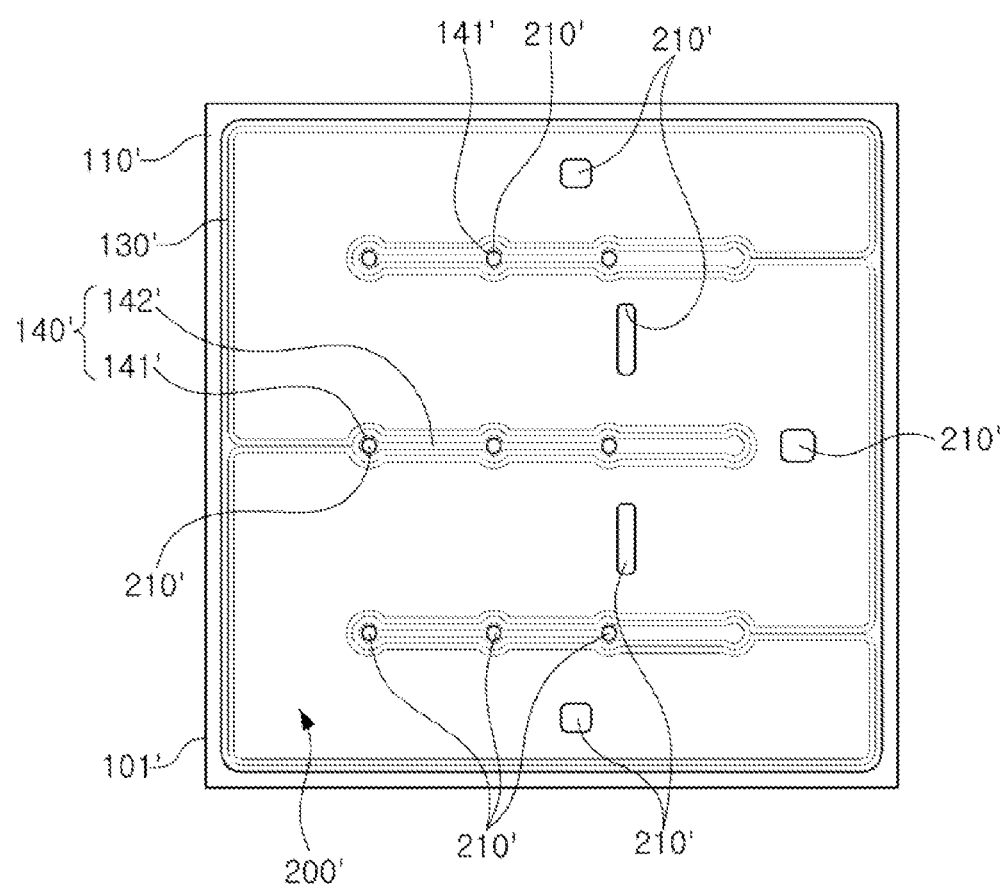
Figure 18B:
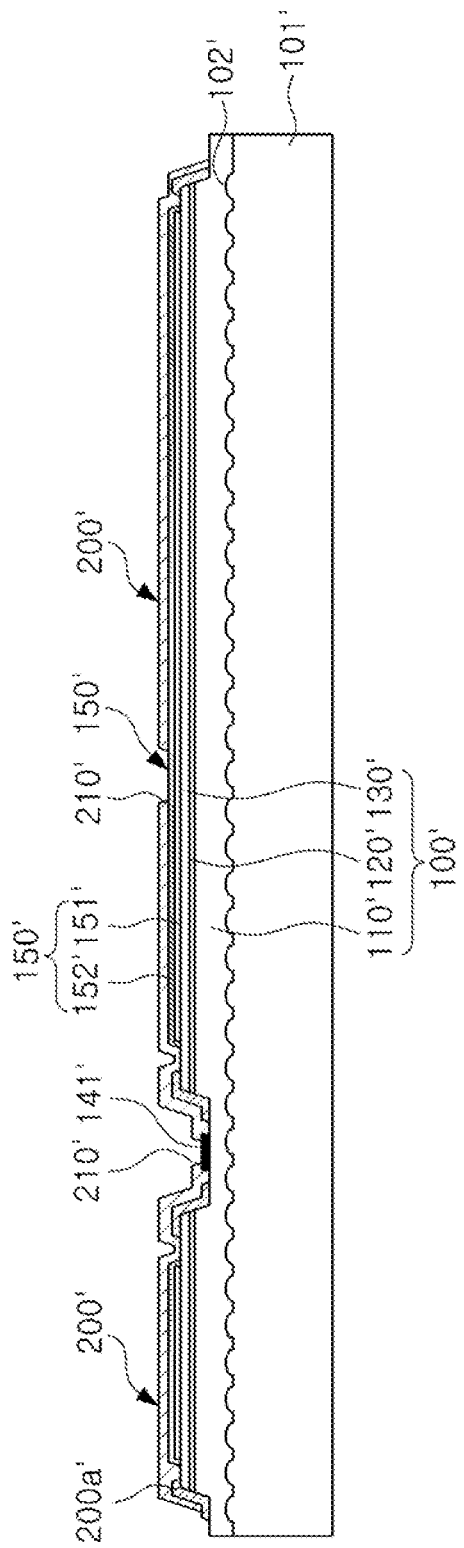

Referring to FIGS. 18A and 18B, a first insulating layer 200' may be provided on the light emitting structure 100' to cover the entirety of the light emitting structure 100'. For example, the first insulating layer 200' may be formed of an epoxy-based insulating resin. Also, the first insulating layer 200' may be formed of a silicon oxide or a silicon nitride and may include, for example, $SiO_2$, $SiN$, $SiO_xN_y$, $TiO_2$, $Si_3N_4$, $Al_2O_3$, $TiN$, $AlN$, $ZrO_2$, $TiAlN$, $TiSiN$, or the like.

The first contact electrode 140' and the second contact electrode 150' may be partially exposed on the first and second conductivity-type semiconductor layers 110' and 130' through the plurality of first openings 210'.

Figure 19A:
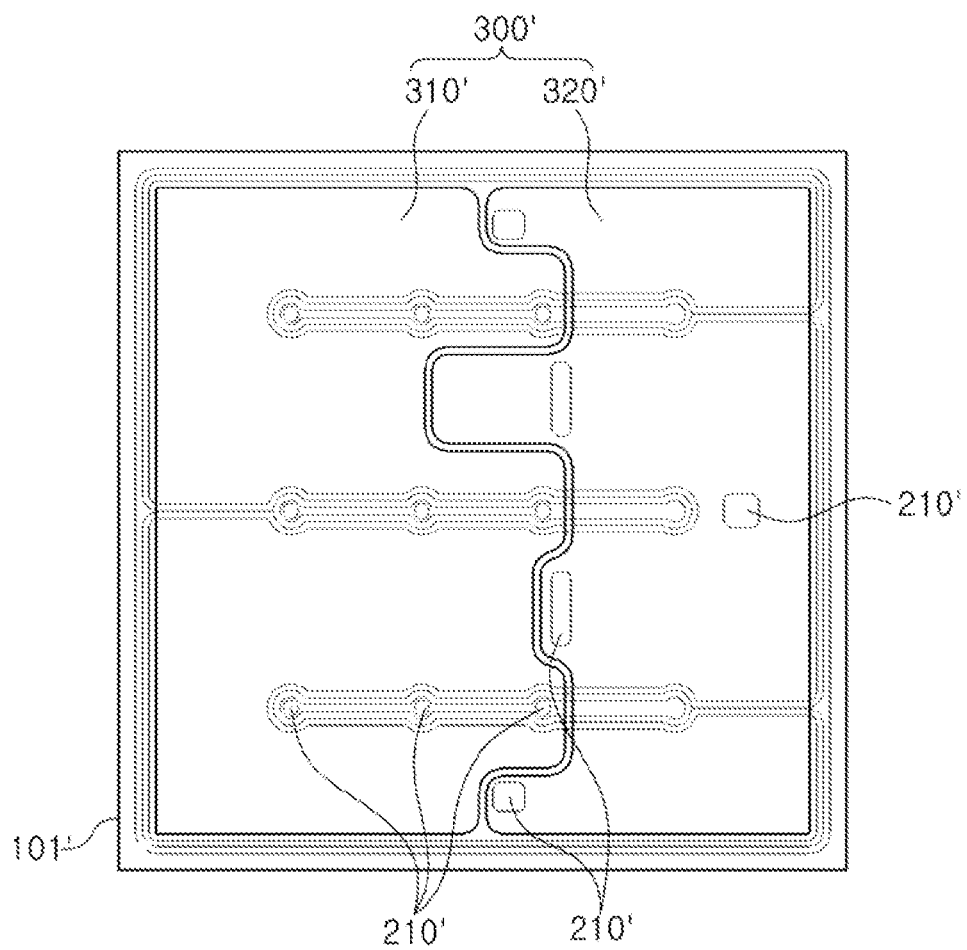
Figure 19B:
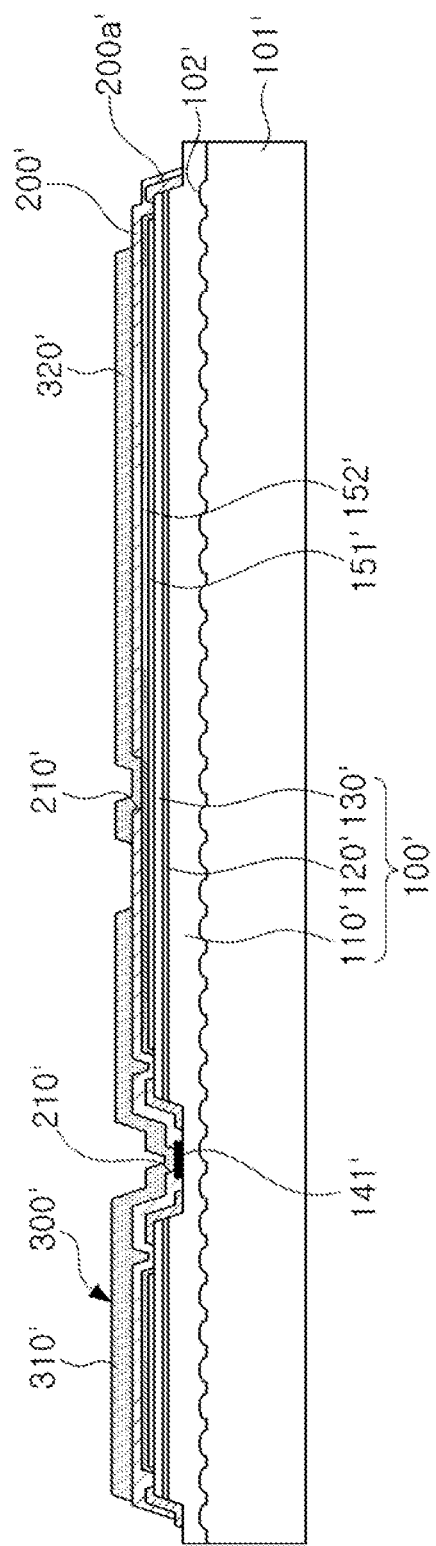

Referring to FIGS. 19A and 19B, a barrier metal layer 300' may be formed on the first insulating layer 200'. The barrier metal layer 300' may be connected to the first and second contact electrodes 140' and 150' exposed through the first openings 210' so as to be electrically connected to the first conductivity-type semiconductor layer 110' and the second conductivity-type semiconductor layer 130', respectively.

The barrier metal layer 300' may be provided at least as a pair in order to electrically insulate the first conductivity-type semiconductor layer 110' and the second conductivity-type semiconductor layer 130'. Namely, a first metal layer 310' is electrically connected to the first conductivity-type semiconductor layer 110' through the first contact electrode 140', a second metal layer 320' may be electrically connected to the second conductivity-type semiconductor layer 130' through the second contact electrode 150', and the first and second metal layers 310' and 320' may be separated to be electrically insulated.

Figure 20A:
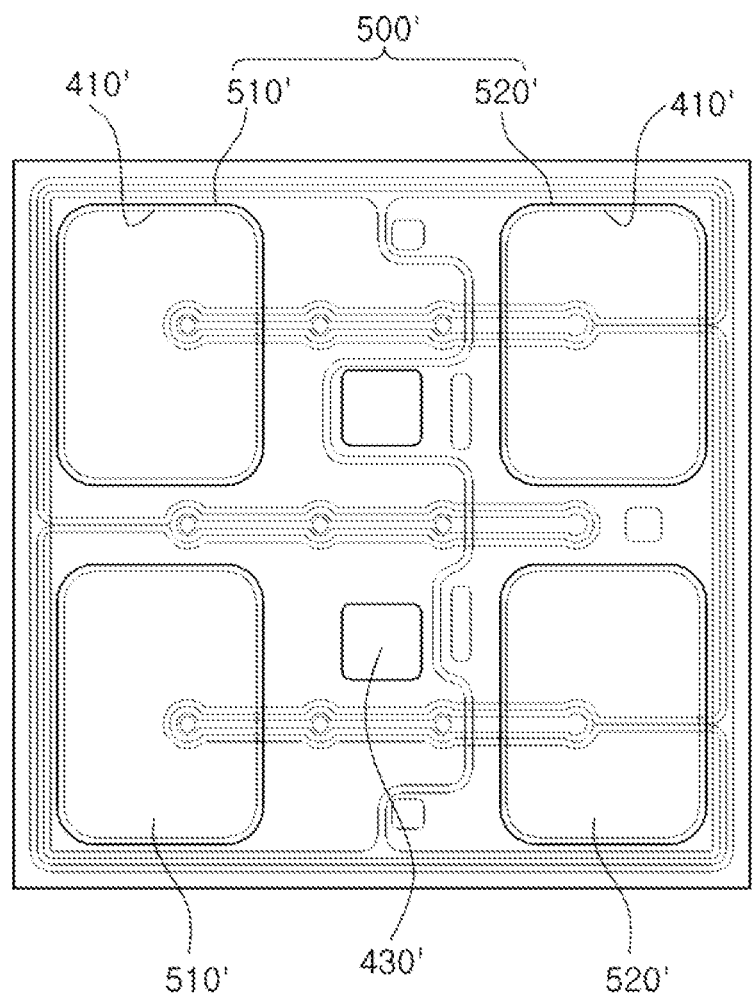
Figure 20B:
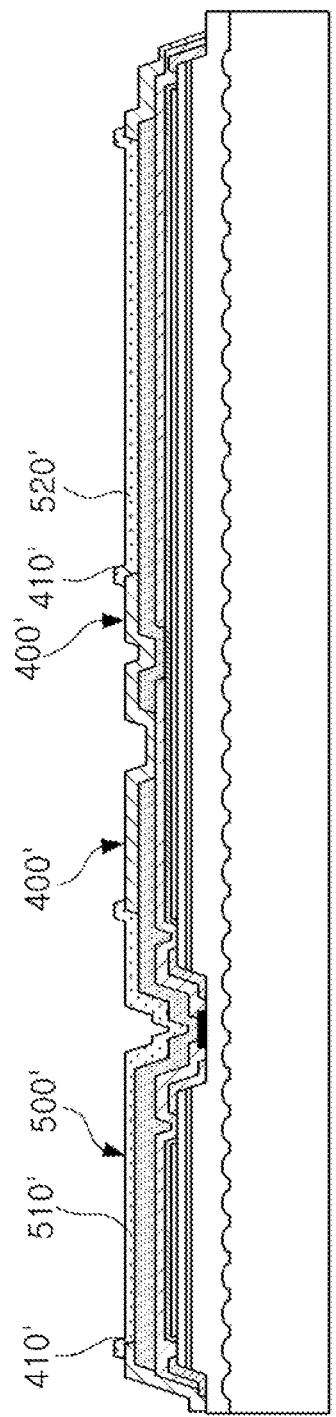

Referring to FIGS. 20A and 20B, a second insulating layer 400' may be formed on the barrier metal layer 300'. The second insulating layer 400' may partially expose the barrier metal layer 300' through the second opening 410'.

The second opening 410' may be provided in plural to partially expose the first metal layer 310' and the second metal layer 320', respectively. In this case, a portion of the plurality of second openings 410' may be disposed so as not to overlap with a portion of the plurality of first openings 210' of the first insulating layer 200'. For example, as illustrated in FIG. 20A, the second opening 410' partially exposing the second metal layer 320', among the plurality of second openings 410', may not overlap with the first opening 210' partially exposing the second contact electrode 150', among the plurality of first openings 210'. Namely, the second openings 410' are not positioned above the first openings 210'.

The second insulating layer 400' may be formed of a material identical to that of the first insulating layer 200'.

Meanwhile, an electrode 500' including a first electrode 510' and a second electrode 520' may be formed on the first and second metal layers 310' and 320' partially exposed through the second openings 410', respectively. The first electrode 510' and the second electrode 520' may be, for example, under-bump metallurgy (UBM) layers. The number and disposition of the first electrode 510' and the second electrode 520' may be variously modified, without being limited to the example embodiments depicted in the accompanying drawings.

Also, as illustrated in FIG. 20A, like the second opening 410', the second insulating layer 400' may further include open regions 430' partially exposing the first and second metal layers 310' and 320', respectively. The open regions 430' serves to allow a manufactured semiconductor light emitting device to be checked before being released as a product. An operation of a manufactured semiconductor light emitting device may be checked by connecting a probe pin (not shown) to the first and second metal layers 310' and 320' exposed to the open regions 430' and supplying driving power.

Figure 21A:
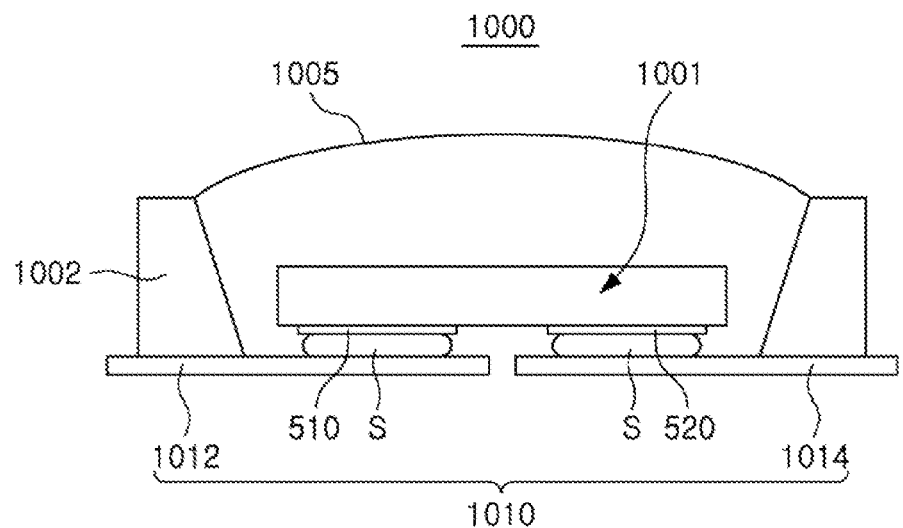
FIGS. 21A and 21B are cross-sectional views schematically illustrating examples of packages employing a semiconductor light emitting device according to example embodiments.
Figure 21B:
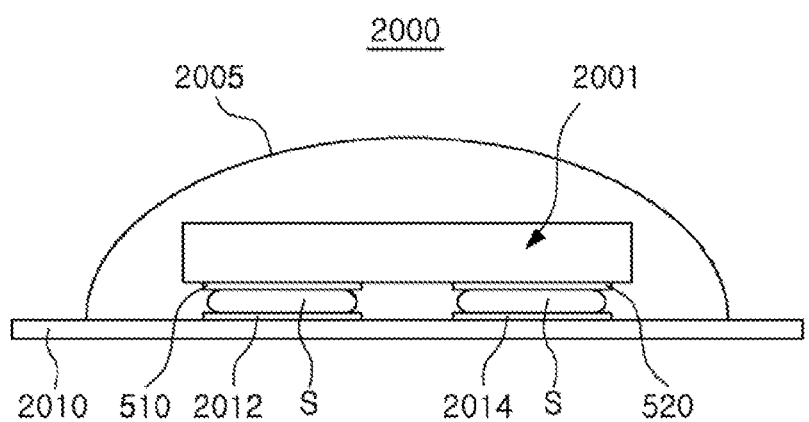

FIGS. 21A and 21B are cross-sectional views schematically illustrating examples of packages employing a semiconductor light emitting device according to example embodiments.

Referring to FIG. 21A, a semiconductor light emitting device package 1000 may include a semiconductor light emitting device 1001 as a light source, a package body 1002, a pair of lead frames 1010, and an encapsulant 1005. Here, the semiconductor light emitting device 1001 may be the semiconductor light emitting device 10 of FIG. 1 or the semiconductor light emitting device 10' of FIG. 12 and descriptions thereof will be omitted.

The semiconductor light emitting device 1001 may be mounted on the lead frames 1010 and electrically connected to the lead frames through a conductive bonding material. The conductive bonding material may be, for example, a Sn solder S.

The pair of lead frames 1010 may include a first lead frame 1012 and a second lead frame 1014. Referring to FIG. 1, the first electrode 510 and the second electrode 520 of the semiconductor light emitting device 1001 may be connected to the first lead frame 1012 and the second lead frame 1014, respectively, through Sn solders S interposed between the semiconductor light emitting device 1001 and the pair of lead frames 1010.

The package body 1002 may have a reflective cup to enhance light reflection efficiency and light extraction efficiency. The encapsulant 1005 formed of a light-transmissive material may be formed in the reflective cup to encapsulate the semiconductor light emitting device 1001.

Referring to FIG. 21B, in example embodiments, a semiconductor light emitting device package 2000 may include a semiconductor light emitting device 2001, a mounting board 2010, and an encapsulant 2005. Here, the semiconductor light emitting device 2001 may be the semiconductor light emitting device 10 of FIG. 1 or the semiconductor light emitting device 10' of FIG. 12 and descriptions thereof will be omitted.

The semiconductor light emitting device 2001 may be mounted on the mounting board 2010 and electrically connected to first and second circuit patterns 2012 and 2014. The semiconductor light emitting device 2001 may be encapsulated by the encapsulant 2005. In this manner, a chip-on-board (COB) type package structure may be implemented.

The mounting board 2010 may be provided as a printed circuit board (PCB), metal-core printed circuit board (MCPCB), a metal printed circuit board (MPCB), a flexible printed circuit board (FPCB), or the like, and a structure of the mounting board 2010 may be applied to have various forms.

Figure 22:
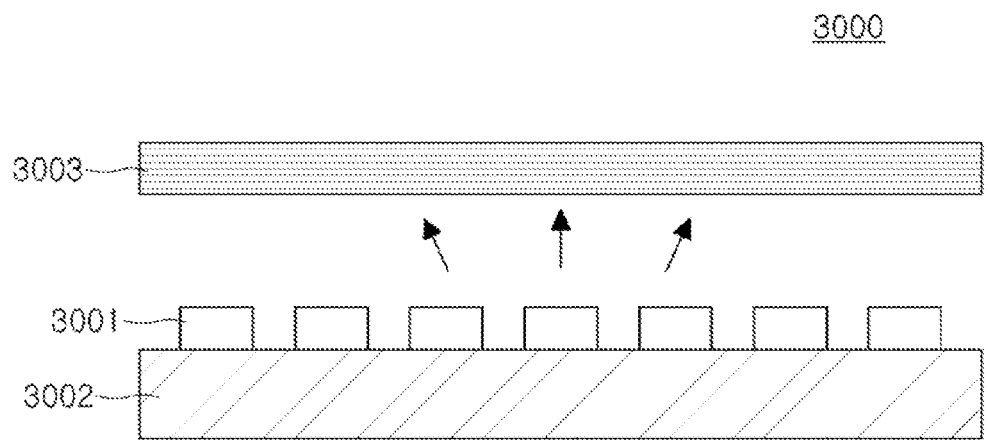
FIGS. 22 and 23 are cross-sectional views illustrating examples of backlight units employing a semiconductor light emitting device according to example embodiments.
Figure 23:
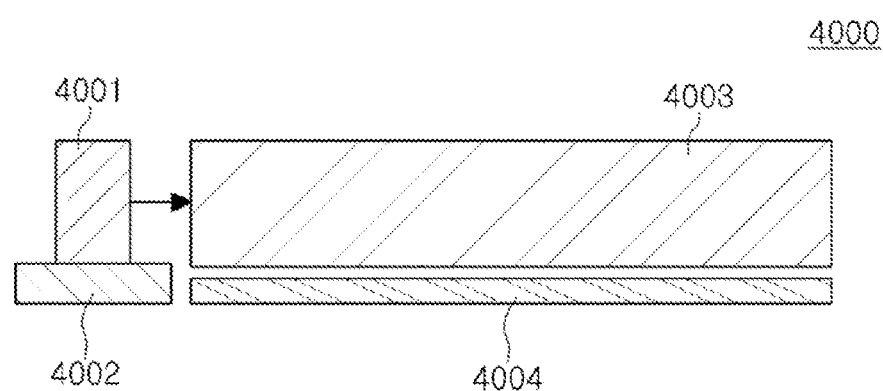

FIGS. 22 and 23 are cross-sectional views illustrating examples of backlight units employing a semiconductor light emitting device according to example embodiments.

Referring to FIG. 22, a backlight unit 3000 includes light sources 3001 mounted on a substrate 3002 and one or more optical sheets 3003 disposed above the light sources 3001. The semiconductor light emitting device package having the structure described above with reference to FIGS. 21A and 21B or a structure similar thereto may be used as the light sources 3001. Alternatively, a semiconductor light emitting device may be directly mounted on the substrate 3002 (a so-called COB type) and used.

Unlike the backlight unit 3000 in FIG. 22 in which the light sources 3001 emit light toward an upper side where a liquid crystal display is disposed, a backlight unit 4000 as another example illustrated in FIG. 23 is configured such that a light source 4001 mounted on a substrate 4002 emits light in a lateral direction, and the emitted light may be made to be incident to a light guide plate 4003 so as to be converted into a surface light source. Light, passing through the light guide plate 4003, is emitted upwards, and in order to enhance light extraction efficiency, a reflective layer 4004 may be disposed on a lower surface of the light guide plate 4003.

Figure 24:
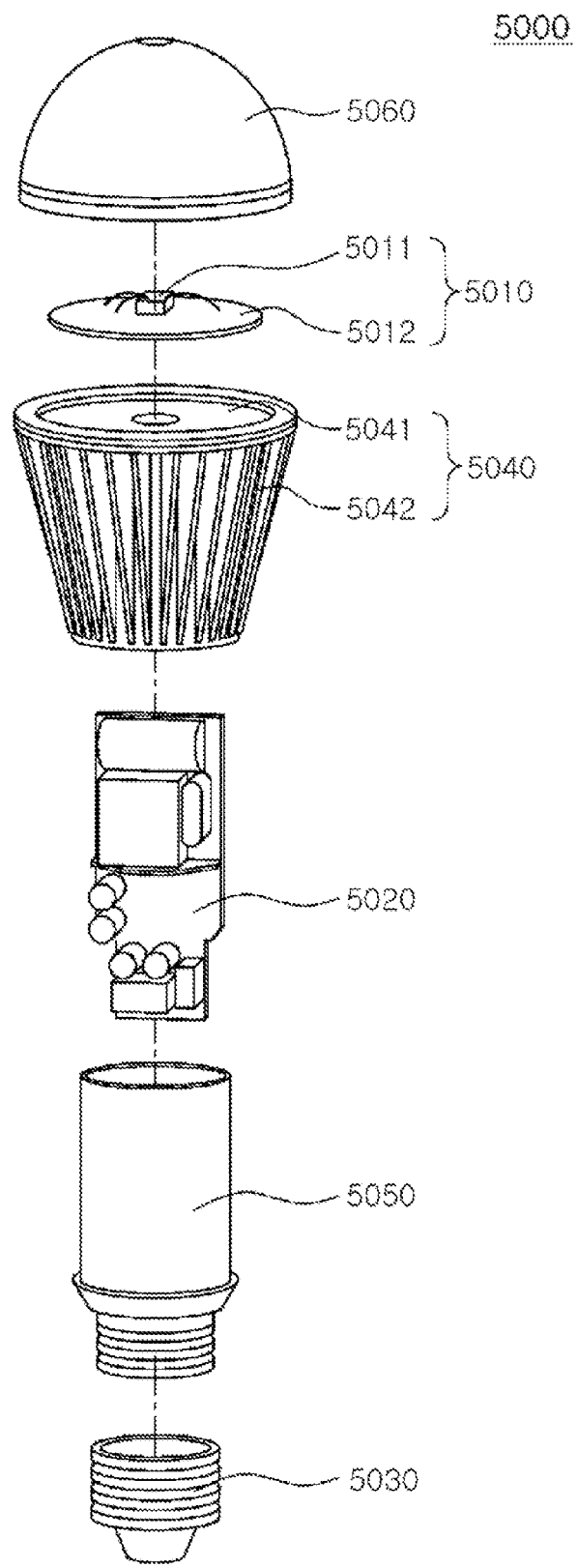
FIGS. 24 and 25 are exploded perspective views illustrating examples of lighting devices employing a semiconductor light emitting device according to example embodiments.
Figure 25:
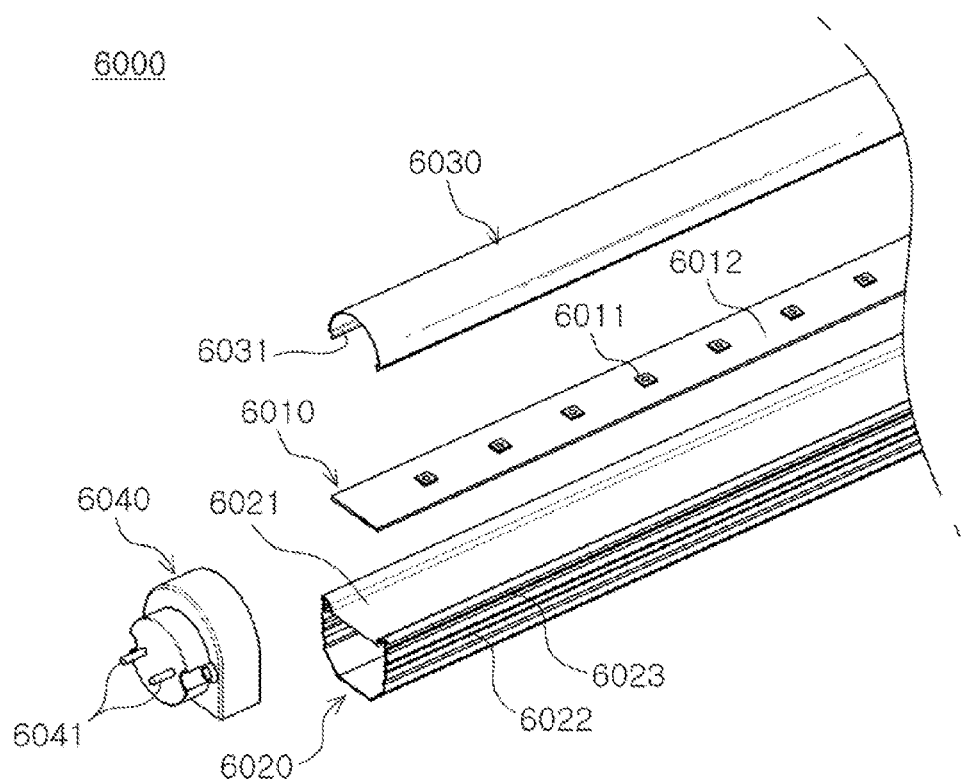

FIGS. 24 and 25 are exploded perspective views illustrating examples of lighting devices employing a semiconductor light emitting device according to example embodiments.

Referring to FIG. 24, a lighting device 5000 is illustrated as, for example, a bulb-type lamp and includes a light emitting module 5010, a driving unit 5020, and an external connection unit 5030. Also, the lighting device 5000 may further include external structures such as external and internal housings 5040 and 5050 and a cover unit 5060.

The light emitting module 5010 may include a semiconductor light emitting device 5011 having a structure identical or similar to those of the semiconductor light emitting devices 10 and 10' of FIGS. 1 and 12 and a circuit board 5012 having the semiconductor light emitting device 5011 mounted thereon. In example embodiments, it is illustrated that an individual semiconductor light emitting device 5011 is mounted on the circuit board 5012, but a plurality of semiconductor light emitting devices may be installed as needed. Also, the semiconductor light emitting device 5011 may be manufactured as a package and subsequently mounted, rather than being directly mounted on the circuit board 5012.

The external housing 5040 may serve as a heat dissipation unit and may include a heat dissipation plate 5041 disposed to be in direct contact with the light emitting module 5010 to enhance heat dissipation and heat dissipation fins 5042 surrounding the lateral surfaces of the external housing 5040. The cover unit 5060 may be installed on the light emitting module 5010 and have a convex lens shape. The driving unit 5020 may be installed in the internal housing 5050 and connected to the external connection unit 5030 having a socket structure to receive power from an external power source. Also, the driving unit 5020 may serve to convert power into an appropriate current source for driving the semiconductor light emitting device 5011 of the light emitting module 5010, and provide the same. For example, the driving unit 5020 may be configured as an AC-DC converter, a rectifying circuit component, or the like.

Also, although not shown, the lighting device 5000 may further include a communications module.

Referring to FIG. 25, a lighting device 6000 may be a bar-type lamp, for example, and may include a light emitting module 6010, a body unit 6020, a cover unit 6030, and a terminal unit 6040.

The light emitting module 6010 may include a board 6012 and a plurality of semiconductor light emitting devices 6011 mounted on the board 6012. As the semiconductor light emitting devices 6011, the semiconductor light emitting devices 10 and 10' illustrated in FIGS. 1 and 12 or the semiconductor light emitting device packages 1000 and 2000 illustrated in FIGS. 21A and 21B may be employed.

The body unit 6020 may allow the light emitting module 6010 to be fixedly mounted on one surface thereof by means of a recess 6021, and dissipate heat generated by the light emitting module 6010 outwardly. Thus, the body unit 6020 may include a heat sink as a support structure and have a plurality of heat dissipation fins 6022 protruded from both lateral surfaces thereof.

The cover unit 6030 may be fastened to a stopping recess 6023 of the body unit 6020 and may have a semi-circular curved surface to allow light to be evenly irradiated outwardly on the whole. A protrusion 6031 may be formed on a bottom surface of the cover unit 6030 in a length direction and engaged with the stopping recess 6023 of the body unit 6020.

The terminal unit 6040 may be provided to at least one open end portion among both end portions of the body unit 6020 in the length direction and supply power to the light emitting module 6010 and may include electrode pins 6041 protruded outwardly.

As set forth above, according to example embodiments of the present inventive concept, a semiconductor light emitting device in which an Sn solder is fundamentally limited and/or prevented from being spread, and a semiconductor light emitting apparatus having the same may be provided.

Advantages and effects of the present inventive concept are not limited to the foregoing content and any other technical effects not mentioned herein may be easily understood by a person skilled in the art from the foregoing description.

While some example embodiments have been shown and described above, it will be apparent to those skilled in the art that modifications and variations could be made without departing from the spirit and scope of the claims.

What is claimed is:

1. A semiconductor light emitting device comprising:
   a light emitting structure, the light emitting structure including a first conductivity-type semiconductor layer, an active layer on the first conductivity-type semiconductor layer, and a second conductivity-type semiconductor layer on the active layer;
   a first insulating layer on the light emitting structure, the first insulating layer defining a plurality of first openings, a first one of the plurality of first openings exposing the first conductivity-type semiconductor layer and a second one of the plurality of first openings exposing the second conductivity-type semiconductor layer;
   a barrier metal layer on the first insulating layer, the barrier metal layer being electrically connected to the first conductivity-type semiconductor layer and the second conductivity-type semiconductor layer through the first one and the second one of the plurality of first openings;
   a second insulating layer on the barrier metal layer, the second insulating layer defining a second opening that partially exposes the barrier metal layer; and
   an electrode on the barrier metal layer, the electrode being electrically connected to the first conductivity-type semiconductor layer and the second conductivity-type semiconductor layer through the barrier metal layer and the second opening, and
   at least one of the first and second insulating layers and the barrier metal layer are between the electrode and the light emitting structure.

2. The semiconductor light emitting device of claim 1, wherein at least part of the second insulating layer is over a portion of the barrier metal layer in the first one and the second one of the plurality of first openings.

3. The semiconductor light emitting device of claim 1, wherein the plurality of first openings and the second opening do not overlap with each other.

4. The semiconductor light emitting device of claim 1, wherein
   the light emitting structure includes a plurality of mesa regions partially demarcated by an etched region, and
   the etched region is defined by a trench in the second conductivity-type semiconductor layer, the active layer, and the first conductivity-type semiconductor layer.

5. The semiconductor light emitting device of claim 4, wherein
   the etched region extends from one side of the light emitting structure to an other side of the light emitting structure that is opposite the one side, and
   the etched region is one of a plurality of etched regions that are parallel to each other.

6. The semiconductor light emitting device of claim 4, further comprising:
   a first contact electrode on an upper surface of the first conductivity-type semiconductor layer exposed by the etched region, wherein
   the first contact electrode is connected to the first conductivity-type semiconductor layer, and
   the first contact electrode is connected to the electrode through the barrier metal layer.

7. The semiconductor light emitting device of claim 6, wherein
   the first contact electrode includes a plurality of pad portions and a plurality of finger portions, and
   the plurality of finger portions respectively extend from the plurality of pad portions in the etched region.

8. The semiconductor light emitting device of claim 7, wherein
   the plurality of pad portions are directly connected to the barrier metal layer.

9. The semiconductor light emitting device of claim 4, further comprising:
   a second contact electrode on an upper surface of the plurality of mesa regions, wherein
   the second contact electrode is connected to the second conductivity-type semiconductor layer, and the second contact electrode is connected to the electrode through the barrier metal layer.

10. The semiconductor light emitting device of claim 9, wherein the second contact electrode includes a reflective metal layer.

11. The semiconductor light emitting device of claim 10, wherein the second contact electrode includes a coating metal layer on the reflective metal layer.

12. The semiconductor light emitting device of claim 4, further comprising:
    a passivation layer on a lateral surface of the mesa region, wherein
    the passivation layer covers a part of the active layer exposed by the etched region.

13. The semiconductor light emitting device of claim 1, wherein the electrode includes at least one first electrode and at least one second electrode.

14. A semiconductor light emitting device comprising:
    a light emitting structure,
       the light emitting structure including a stacked structure of a first conductivity-type semiconductor layer, an active layer on the first conductivity-type semiconductor layer, and a second conductivity-type semiconductor layer on the active layer, and
       the light emitting structure including a mesa region partially demarcated by an etched region, the etched region being defined by a trench in the second conductivity-type semiconductor layer, the active layer, and the first conductivity-type semiconductor layer;
    a first insulating layer on the light emitting structure;
    a barrier metal layer on the first insulating layer, the barrier metal layer penetrating through the first insulating layer and being electrically connected to the first conductivity-type semiconductor layer and the second conductivity-type semiconductor layer;
    a second insulating layer on the barrier metal layer; and
    an electrode on a portion of the barrier metal layer exposed from the second insulating layer, the electrode being electrically connected to the first conductivity-type semiconductor layer and the second conductivity-type semiconductor layer through the barrier metal layer,
    the electrode over the light emitting structure, and
    the first insulating layer and the barrier metal layer or the barrier metal layer and the second insulating layer being between the electrode and the light emitting structure.

15. The semiconductor light emitting device of claim 14, wherein
    the first insulating layer defines a plurality of first openings,
    a first one of the plurality of first openings exposes the first conductivity-type semiconductor layer,
    a second one of the plurality of first openings exposes the second conductivity-type semiconductor layer, the second insulating layer defines a second opening that partially exposes the barrier metal layer, and the plurality of first openings and the second opening do not overlap with each other.

16. A semiconductor light emitting device comprising:
a light emitting structure;
a dual-barrier structure on the light emitting structure,
the dual-barrier structure including a barrier metal layer on a first insulating layer;
the first insulating layer defining openings that expose a first portion and a second portion, respectively, of the light emitting structure,
the barrier metal layer including a first barrier metal layer and a second barrier metal layer that are electrically connected to the first portion and the second portion, respectively, of the light emitting structure through different ones of the openings defined by the first insulating layer;
a second insulating layer on the dual-barrier structure,
the second insulating layer defining at least one opening that exposes the first barrier metal layer and at least one opening that exposes the second barrier metal layer;
an electrode on the dual-barrier structure and at least part of the second insulating layer such that the barrier metal layer and at least one of the first and second insulating layers are between the electrode and the light emitting structure.

17. The semiconductor light emitting device of claim 16, wherein
the light emitting structure includes a first conductivity type semiconductor layer, an active layer on the first conductivity-type semiconductor layer, and a second conductivity type semiconductor layer on the active layer,
the first conductivity-type semiconductor layer and the second conductivity-type semiconductor layer are different conductivity types,
the light emitting structure includes a mesa region demarcated by a trench that extends through the active layer and the second conductivity-type semiconductor layer to the first conductivity-type semiconductor layer,
the electrode includes at least one first electrode that is spaced apart from at least one second electrode,
the first portion of the light emitting structure is an area of the first conductivity-type semiconductor layer that is exposed by the trench,
the at least one first electrode is electrically connected to the first portion of the light emitting structure through the first barrier metal layer,
the second portion of the light emitting structure is an area of the second conductivity-type semiconductor layer exposed by at least one of the openings defined by the first insulating layer, and
the least one second electrode is electrically connected to the second portion of the light emitting structure through the second barrier metal layer.

18. The semiconductor light emitting device of claim 16, wherein the second insulating layer extends over the openings defined by the first insulating layer.

19. The semiconductor light emitting device of claim 16, wherein the openings defined by the first insulating layer do not overlap with the at least one opening that exposes the first barrier metal layer defined by the second insulating layer and the at least one opening that exposes the second barrier metal layer defined by the second insulating layer.

20. The semiconductor light emitting device of claim 16, further comprising:
a passivation layer covering a lateral surface of the trench.

* * * * *